US011134662B2

United States Patent
Constantz

(10) Patent No.: US 11,134,662 B2
(45) Date of Patent: Oct. 5, 2021

(54) CO-LOCATION OF A HEAT SOURCE COOLING SUBSYSTEM AND AQUACULTURE

(71) Applicant: DeepWater Desal LLC, Moss Landing, CA (US)

(72) Inventor: Brent R. Constantz, Portola Valley, CA (US)

(73) Assignee: DeepWater Desal LLC, Moss Landing, CA (US)

(*) Notice: Subject to any disclaimer, the term of this patent is extended or adjusted under 35 U.S.C. 154(b) by 83 days.

(21) Appl. No.: 16/407,547

(22) Filed: May 9, 2019

(65) Prior Publication Data
US 2019/0313613 A1  Oct. 17, 2019

Related U.S. Application Data

(63) Continuation of application No. 14/773,291, filed as application No. PCT/US2014/024829 on Mar. 12, 2014, now Pat. No. 10,334,828.
(Continued)

(51) Int. Cl.
*A01K 63/06* (2006.01)
*A01K 61/54* (2017.01)
(Continued)

(52) U.S. Cl.
CPC ............ *A01K 63/065* (2013.01); *A01K 61/10* (2017.01); *A01K 61/54* (2017.01); *H05K 7/2079* (2013.01); *Y02E 10/30* (2013.01)

(58) Field of Classification Search
CPC ........ A01K 61/10; A01K 61/59; A01K 61/80; A01K 63/065
(Continued)

(56) References Cited

U.S. PATENT DOCUMENTS 3,735,736 A  5/1973  Yee et al.
3,822,504 A  7/1974  Kuehn et al.
(Continued)

FOREIGN PATENT DOCUMENTS

CN  2895398 Y  5/2007
CN  102050506 A  5/2011
(Continued)

OTHER PUBLICATIONS

Hani et al., The Preliminary Research of Sea Water District Heating and Cooling for Tallinn Coastal Area, Smart Grid and Renewable Energy, 2012, vol. 3, p. 246-252.
(Continued)

*Primary Examiner* — Yvonne R Abbott-Lewis
(74) *Attorney, Agent, or Firm* — Peter W. Schroen; Bret E. Field; Bozicevic, Field & Francis LLP

(57) ABSTRACT

The present disclosure provides systems for heat source, e.g., data center, cooling and aquaculture. In certain aspects, the systems include a heat source, e.g., data center, having a water cooling subsystem configured to receive cool water and output warm water and an aquaculture center co-located with the heat source, e.g., data center, and configured to receive the warm water. Aspects of the invention also include methods for cooling a heat source, e.g., data center, using a water cooling subsystem and cultivating aquatic organisms with an aquaculture center that is co-located with the heat source, e.g., data center.

20 Claims, 2 Drawing Sheets

Related U.S. Application Data

(60) Provisional application No. 61/800,481, filed on Mar. 15, 2013.

(51) Int. Cl.
*A01K 61/10* (2017.01)
*H05K 7/20* (2006.01)

(58) Field of Classification Search
USPC .................. 119/215, 223, 226, 228, 245
See application file for complete search history.

(56) References Cited

U.S. PATENT DOCUMENTS

| | | |
|---|---|---|
| 4,110,174 A | 8/1978 | Carson |
| 4,151,810 A * | 5/1979 | Wiggins ............ A01K 63/065 119/262 |
| 4,202,291 A * | 5/1980 | Kominami ............ A01K 63/00 119/226 |
| 4,258,661 A * | 3/1981 | Margen ................ A01K 61/00 119/229 |
| 4,726,191 A | 2/1988 | Kawamura |
| 5,979,363 A | 11/1999 | Shaar |
| 6,833,056 B1 | 12/2004 | Kamiya et al. |
| 6,932,889 B1 | 8/2005 | Holcomb |
| 7,525,207 B2 | 4/2009 | Clidaras et al. |
| 7,886,537 B2 | 2/2011 | Jagusztyn et al. |
| 8,322,139 B2 | 12/2012 | Takahashi et al. |
| 8,567,195 B2 | 10/2013 | Nash |
| 9,609,811 B2 * | 4/2017 | Saumweber ........ A01K 63/065 |
| 2003/0121856 A1 | 7/2003 | Voutchkov |
| 2004/0065614 A1 | 4/2004 | Gordon et al. |
| 2004/0107914 A1 | 6/2004 | Untermeyer et al. |
| 2004/0206681 A1 | 10/2004 | Gordon |
| 2006/0169216 A1 | 8/2006 | Shields et al. |
| 2007/0084778 A1 | 4/2007 | St. Germain et al. |
| 2007/0131534 A1 | 6/2007 | Capan |
| 2008/0093859 A1 | 4/2008 | Catlin |
| 2009/0078401 A1 | 3/2009 | Cichanowicz |
| 2009/0112374 A1 | 4/2009 | Kirchhof et al. |
| 2009/0159010 A1 * | 6/2009 | Spartz ................ A01K 63/003 119/200 |
| 2009/0216920 A1 | 8/2009 | Lauterbach et al. |
| 2009/0230686 A1 | 9/2009 | Catlin |
| 2009/0295167 A1 | 12/2009 | Clidaras et al. |
| 2010/0072136 A1 | 3/2010 | Voutchkov |
| 2010/0191998 A1 | 7/2010 | Moore |
| 2010/0237015 A1 | 9/2010 | Voutchkov |
| 2010/0270237 A1 | 10/2010 | Efraty |
| 2010/0314313 A1 | 12/2010 | MacLaggan |
| 2011/0100618 A1 | 5/2011 | Carlson |
| 2012/0011849 A1 | 1/2012 | Cole et al. |
| 2012/0055857 A1 | 3/2012 | Marin et al. |
| 2012/0091729 A1 | 4/2012 | Nash |
| 2012/0210257 A1 | 8/2012 | Mosley et al. |
| 2012/0211409 A1 | 8/2012 | Dubowsky et al. |
| 2012/0247149 A1 | 10/2012 | Labelle |
| 2013/0005015 A1 | 1/2013 | Jovine |
| 2013/0025842 A1 | 1/2013 | Carlson et al. |
| 2013/0042612 A1 | 2/2013 | Shapiro et al. |
| 2013/0055960 A1 | 3/2013 | Chibras et al. |
| 2013/0273599 A1 | 10/2013 | Robitaille et al. |
| 2015/0090647 A1 | 4/2015 | Duke et al. |
| 2015/0166371 A1 | 6/2015 | Escher et al. |

FOREIGN PATENT DOCUMENTS

| | | |
|---|---|---|
| CN | 201843652 U | 5/2011 |
| CN | 202193691 U | 4/2012 |
| EP | 1240076 B1 | 3/2003 |
| EP | 1562693 B1 | 6/2008 |
| GB | 1260214 A | 1/1972 |
| GB | 2400603 A | 10/2004 |
| JP | 2010-267707 A | 11/2010 |
| KR | 10-2006-0122406 A | 11/2006 |
| KR | 1000954233 B1 | 4/2010 |
| KR | 10-2011-0037589 A | 4/2011 |
| KR | 10-2011-0075384 A | 7/2011 |
| WO | WO8804193 A1 | 6/1988 |
| WO | WO2010129341 A1 | 11/2010 |
| WO | WO2011017482 A1 | 4/2011 |
| WO | WO2013027097 A1 | 2/2013 |

OTHER PUBLICATIONS

Briand, Effects of power-plant cooling systems on marine phytoplankton, Marine Biology (1975), 33(2):135-146, Abstract Only.
Cooling Power Plants, http://www.world-nuclear.org/info/current-and-future-generation/cooling-power-plants/, 14 pages, Accessed on Jan. 16, 2015.
Elimelech et al., The future of seawater desalination: energy, technology, and the environment, Science (2011), 333(6043):712-717.
Emura et al., Pumping of Low-Temperature Deep Sea Water for Cooling of Facilities on Land, OCEANS '83, Proceedings, Aug. 29-Sep. 1, 1983, San Francisco, p. 871-874, Abstract Only.
Fritzmann et al., State-of-the-art of reverse osmosis desalination, Desalination (2007), 216(1-3):1-76.
Makai Ocean Engineering, http://www.makai.com/pipelines/ac-pipelines/, 8 pages, Accessed on Jan. 21, 2015.
Miller, Google Using Sea Water to Cool Finland Project: Data Center Knowledge, Data Center Knowledge, Sep. 15, 2010, XP055296373, Retrieved from the Internet: URL://www.datacenterknowledge.com/archives/2010/09/15/google-using-sea-water-to-cool-finland-project/ [retrieved om Aug. 18, 2016].
Miller, Integrated concepts in water reuse: managing global water needs, Desalination (2006), 187(1-3):65-75.
Nakasone et al., The Application of Deep Sea Water in Japan, UJNR Technical Report No. 28, p. 69-75, Accessed on Jan. 21, 2015.
Once Through Cooling, http://www.healthebay.org/about-bay/current-policy-issues/keeping-animals-healthy/open-ocean-intakes, 2 pages, Accessed on Jan. 16, 2015.
Power Plants Using Once Through Cooling, http://www.cacoastkeeper.org/programs/healthy-marine-habitats/power-plants-otc, 5 pages, Accessed on Jan. 16, 2015.
Smith, The AC of Tomorrow? Tapping Deep Water for Cooling, National Geographic News (2004), http://news.nationalgeographic.com/news/2004/09/0910_040910_deeplake_2.html, 3 pages.
Wu et al., Research on the Development and Application of Heat Pump Energy—Saving Technology by using Seawater as Cold and Heat Source, Journal of Salt and Chemical Industry, 2012, 41(12): 6 pages, Abstract Only.

* cited by examiner

CO-LOCATION OF A HEAT SOURCE COOLING SUBSYSTEM AND AQUACULTURE

CROSS-REFERENCE TO RELATED APPLICATIONS

This application is a continuation of U.S. patent application Ser. No. 14/773,291 filed Sep. 4, 2015, now as issued as U.S. Pat. No. 10,334,828, which application is a U.S. National Phase Application of International Application No. PCT/US2014/024829 filed Mar. 12, 2014, which application, pursuant to 35 U.S.C. § 119 (e), claims priority to the filing date of the U.S. Provisional Patent Application Ser. No. 61/800,481 filed Mar. 15, 2013; the disclosure of which application is herein incorporated by reference.

INTRODUCTION

In recent years, internet traffic in the United States has risen significantly. It is estimated that in the United States, internet traffic increased from 40,000-70,000 terabytes/month in 2001 to 3,400,000-4,100,000 terabytes/month in 2011. To support the steep growth in internet traffic, a large amount of computer-related infrastructure has been developed and implemented. One type of infrastructure that has been increasingly utilized is data centers.

Data centers are facilities that house computer systems and associated components for operation therein. Data centers may include computers, data storage devices, servers, telecommunications systems or other related equipment and may be used to manage, store, process and/or exchange digital information and data. The operation of electrical components within data centers for these functions produces a large amount of heat. As such, many data centers have intricate cooling systems designed to cool electrical components so that the components can function effectively.

Operation of electrical components and cooling systems within data centers often requires a large amount of energy. Data center power use can range from several kW to several tens of MW. Data centers may use, for example, as much electricity as a small town to operate. The power density of a data center may also be more than one-hundred times that of a typical office building.

Due to the high power usage of data centers, data centers are also often responsible for high carbon emissions. For example, it is estimated that in 2007 data centers were responsible for 1.5% of the total electricity consumption in the United States. Likewise, data centers were estimated to be responsible for 0.5% of greenhouse gas emissions in the United States in the same year. The amount of greenhouse gas emissions from data centers is also expected to rise in the future. For example, it is projected that greenhouse gas emission from data centers will double from 2007 levels by 2020.

One factor of how much greenhouse gas emission a data center is responsible for is the energy efficiency of the data center. One common measure of data center energy efficiency is power usage effectiveness, or "PUE". As discussed further below, PUE is the ratio of the amount of total system (e.g., data center) power to the amount of power used by the electronic (e.g., information technology) equipment of the system. The average data center in the United States has a PUE of 2.0. However, data centers have been developed which have a PUE lower than 2.0. Because data centers having a lower PUE value are more energy efficient than those having a higher PUE value, they also have less of an environmental impact (e.g., produce fewer carbon emissions). As such, developing data centers having low PUE values may help reduce the total greenhouse gas emission associated with data centers in the future.

SUMMARY

The present disclosure provides systems for heat source, e.g., data center, cooling and aquaculture. In certain aspects, the systems include a heat source, e.g., data center, having a water cooling subsystem configured to receive cool water and output warm water co-located with (and operatively connected to) an aquaculture center, e.g., where the aquaculture center is configured to receive warm water from the cooling subsystem. Aspects of the invention also include methods for cooling a heat source, e.g., data center, using a water cooling subsystem and cultivating aquatic organisms with an aquaculture center that is co-located with the heat source, e.g., data center.

Systems of the present disclosure, in various instances include a data center having a water cooling subsystem configured to receive cool water and output warm water and an aquaculture center co-located with the data center and comprising a water temperature control subsystem configured to receive the output warm water. In some embodiments, the cool water is received from an ocean or sea.

Certain embodiments of the systems having a water cooling subsystem include a water intake. The water intake may, in some aspects, be positioned at a depth of 15 m or more, such as 20 m or more, 25 m or more, 30 m or more, 35 m or more, etc. in a water source. In particular variations, the water intake is positioned below the photic zone in a water source.

In select versions, the systems include a water discharge configured for discharging water from the aquaculture center. The water discharge is, in particular embodiments, positioned at a depth of 15 m or more in a body of water (e.g., an ocean or sea), such as 20 m or more, 25 m or more, 30 m or more, 35 m or more, etc., in a water source. In some embodiments, the body of water in which the water discharge is positioned is the same ocean or sea in which the water intake of a system is positioned.

The power usage effectiveness (PUE) of the data center of the disclosed systems, in some aspects, is 2 or less. In some aspects, the PUE of the data center of the disclosed systems is between 1 and 1.3. In some instances, the data center and aquaculture center of the disclosed systems are configured to produce fewer carbon emissions as compared to the same data center and aquaculture center operating independently. In particular versions of the systems, the data center and aquaculture center are configured to use less energy per amount of data-center cooling and per volume of aquatic organisms cultivated as compared to the same data center and aquaculture center operating independently.

The disclosed systems, in select aspects, include a power plant co-located with a data center and an aquaculture center. In some instances, the power plant is operably connected to both of the data center and the aquaculture center. In certain aspects of the disclosed systems, the data center, aquaculture center and power plant are configured to produce fewer carbon emissions as compared to the same data center, aquaculture center and power plant operating independently. In certain versions of the systems, the data center, aquaculture center and power plant are configured to use less energy per amount of data-center cooling and per amount of aquatic organisms cultured as compared to the same data center, water desalination plant and power plant operating independently.

Also provided by the present disclosure are methods for cooling a heat source, e.g., a data center and cultivating aquatic organisms. In certain instances, the methods include (1) cooling a heat source, e.g., a data center, with a water cooling subsystem comprising a cool water intake and a warm water discharge; and (2) cultivating aquatic organisms with an aquaculture center comprising a water temperature control subsystem comprising a warm water intake and a cool water discharge, e.g., by using a system as described above.

BRIEF DESCRIPTION OF THE DRAWINGS

The invention may be best understood from the following detailed description when read in conjunction with the accompanying drawings. Included in the drawings are the following figures.

DEFINITIONS

Figure 1:
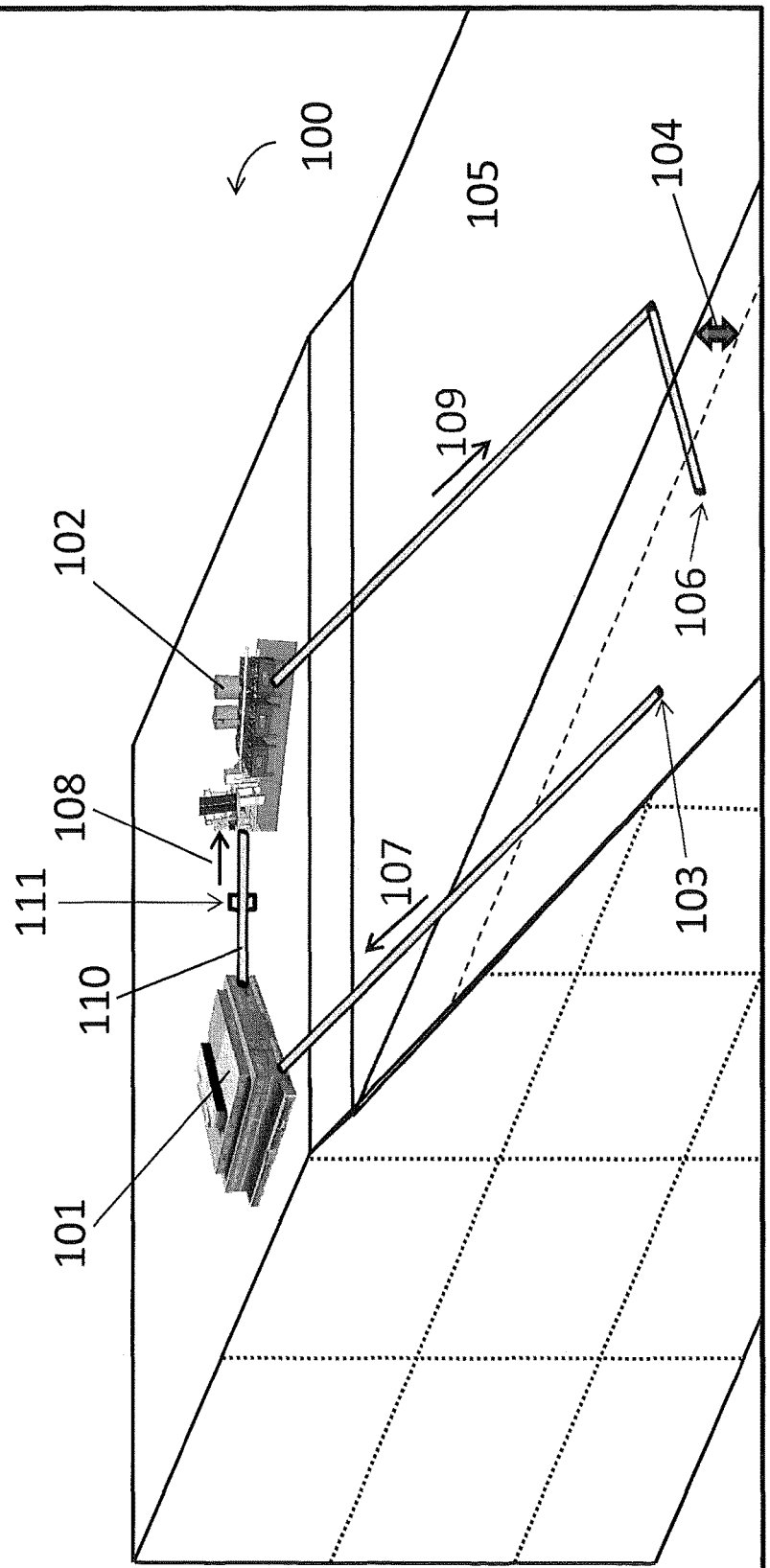
FIG. 1 is a diagram of a system including a data center and aquaculture center co-located with the data center, according to embodiments of the present disclosure.

The term "data center", as used herein and described in further detail below, refers to a facility configured and/or used for physically housing (i.e., containing within it) one or more computer systems and/or associated components. In certain embodiments, data centers include the components therein and manage, store, process and/or exchange digital information and data.

The term "aquaculture", as used herein, is synonymous with the term "aquafarming" and refers to the cultivation (i.e., farming)(e.g., hatching and/or breeding and/or rearing) of aquatic organisms (e.g., fish, crustaceans, mollusks, aquatic plants, etc.). Aquaculture may involve cultivating salt water and/or fresh water populations of organisms under controlled conditions. "Aquaculture" may be "extensive aquaculture", based on local photosynthentical production and/or "intensive aquaculture", in which organisms are fed with external food supply. In certain embodiments wherein aquaculture is specifically limited to the farming of fish, it is referred to as "pisciculture".

By "aquaculture center", as used herein and described in further detail below, is meant a facility configured and/or used for cultivating (i.e., farming) aquatic organisms (i.e., organisms that live and/or grow in, on or near water). In certain embodiments, aquaculture centers house components configured to control conditions important to the cultivation of aquatic organisms (e.g., water temperature, pH, oxygenation, bacterial concentration, etc.).

Likewise, as used herein and described in further detail below, the term "desalination plant" refers to a facility configured and/or used for desalinating water. In some embodiments, desalination plants house components for desalinating water.

The terms "desalinate" and "desalination", as used herein, refer to any of several processes to remove an amount of salt and/or other minerals or components from saline water (i.e., water that contains a concentration of at least one dissolved salt). In some embodiments of the disclosed systems, desali-nation is removing an amount of salt and/or other minerals or components from saline water so that the water is fit for consumption by a living organism (i.e., a living organism may consume the water and thereby maintain a healthy hydration level and/or a living organism may consume the water without the water having a detrimental effect on the organism's health). In some embodiments of the disclosed systems, desalination makes water potable. In certain embodiments the living organism is a "mammal" or "mammalian", where these terms are used broadly to describe organisms which are within the class mammalia, including the orders carnivore (e.g., dogs and cats), rodentia (e.g., mice, guinea pigs, and rats), and primates (e.g., humans, chimpanzees, and monkeys). In some embodiments, the living organism is a human. The term "human" may include human subjects of both genders and at any stage of development (e.g., fetal, neonates, infant, juvenile, adolescent, adult), where in certain embodiments the human subject is a juvenile, adolescent or adult. In some embodiments of the disclosed systems, desalination is removing an amount of salt and/or other minerals or components from saline water so that the water is fit for a specific purpose (e.g., irrigation).

The terms "co-locate", "co-located" and "co-locating", as used herein refer to placing two or more things in proximity (i.e., within a certain distance). In some aspects of the disclosed systems, co-located units may be located such that they share one or more common aspects (e.g., facilities or components such as specific systems or machinery). In some aspects, co-located units may be located, for example, within 0.1 m; 1 m; 10 m; 100 m; 1,000 m; 10,000 m; or 100,000 m of one another. In certain embodiments, co-located units are two or more facilities located on immediately adjacent or abutting areas or parcels of land. In certain embodiments, co-located units are two or more facilities located on the same area of land. In some versions of the disclosed systems, co-located units may be located such that they are in fluid communication (i.e., the units are configured such that at least one fluid may move and/or flow between the units). In certain variations of the disclosed systems, co-located units are located such that they share one or more of the components described herein (e.g., a water cooling subsystem). In certain embodiments of the disclosed systems, co-located units are located such that they are electrically connected (i.e., connected by at least one conductive material) and/or share at least one electrical component. In particular instances, co-located units are located such that their location allows them to be more energy-efficient (i.e., use less energy for the same amount of productivity) than the units would be if they were located in a different position (e.g., a greater distance away from each other). In various embodiments, co-located units are located such that their location allows them to produce fewer carbon emissions (e.g., carbon dioxide emissions) or have a smaller carbon footprint than the units would if they were located in a different position (e.g., a greater distance away from each other). In select versions, co-located units are located such that their location allows them to minimize potential pollutants (e.g., thermal pollution) emitted therefrom. In certain versions of the disclosed systems, co-located units may be located such that they are operably connected.

By "operably connected", as used herein, is meant connected in a specific way (e.g., in a manner allowing water to move and/or electric power to be transmitted) that allows the disclosed system and its various components to operate effectively in the manner described herein. For example, a power plant operably connected to a data center may allow electricity to flow (i.e., be transmitted along at least one conductive material) between the power plant and the data center such that the energy required to operate the data center would be at least partially obtained from the power plant.

DETAILED DESCRIPTION

The present disclosure provides systems for heat source, e.g., data center, cooling and aquaculture. In certain aspects, the systems include a heat source, e.g., data center, having a water cooling subsystem configured to receive cool water and output warm water and an aquaculture center co-located with the heat source, e.g., data center, and configured to receive the warm water. Aspects of the invention also include methods for cooling a heat source, e.g., data center, using a water cooling subsystem and cultivating aquatic organisms with an aquaculture center that is co-located with the heat source, e.g., data center.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, some potential and exemplary methods and materials may now be described. Any and all publications mentioned herein are incorporated herein by reference to disclose and describe the methods and/or materials in connection with which the publications are cited. It is understood that the present disclosure supersedes any disclosure of an incorporated publication to the extent there is a contradiction.

It must be noted that as used herein and in the appended claims, the singular forms "a", "an", and "the" include plural referents unless the context clearly dictates otherwise. Thus, for example, reference to "an intake" includes a plurality of such intakes and reference to "the material" includes reference to one or more materials and equivalents thereof known to those skilled in the art, and so forth.

It is also noted that definitions provided in one section of this application (e.g., the "Systems" section) may also apply to embodiments described in another section of the application (e.g., the "Methods" section) even if a term is described as applying to an embodiment of a particular section.

It is further noted that the claims may be drafted to exclude any element which may be optional. As such, this statement is intended to serve as antecedent basis for use of such exclusive terminology as "solely", "only" and the like in connection with the recitation of claim elements, or the use of a "negative" limitation.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. To the extent such publications may set out definitions of a term that conflict with the explicit or implicit definition of the present disclosure, the definition of the present disclosure controls.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Systems

The present disclosure provides systems for heat source cooling and aquaculture. The systems include a heat source having a water cooling subsystem configured to receive and output water (e.g., cool and warm water, respectively) and an aquaculture center co-located with the heat source and configured to receive the output water (e.g., warm water).

In the broadest sense, any heat source that may be cooled with a water cooling subsystem may be colocated in systems of the invention. Heat sources of interest include, but are not limited to: data centers, power plants, power generators (e.g., reciprocating engines), refrigeration facilities, etc. For purposes of further description, heat sources of the invention are further described in terms of data center embodiments. However, it is understood that the invention is not so limited.

FIG. 1 provides a diagram of one embodiment of a disclosed system 100 including a data center 101, an aquaculture center 102 co-located with the data center, a water intake 103 positioned below the photic zone 104 in a water source 105, a water discharge 106 positioned below the photic zone 104 in a body of water which, in this version, is the same as the water source. FIG. 1 also depicts possible directions of water movement within the system 107-109, an operable connection 110 (e.g., a connection through which water may move and/or electric power may be transmitted) between the aquaculture center 101 and desalination plant 102, and a coupling component (111), as well as other components and aspects described further below.

Figure 2:
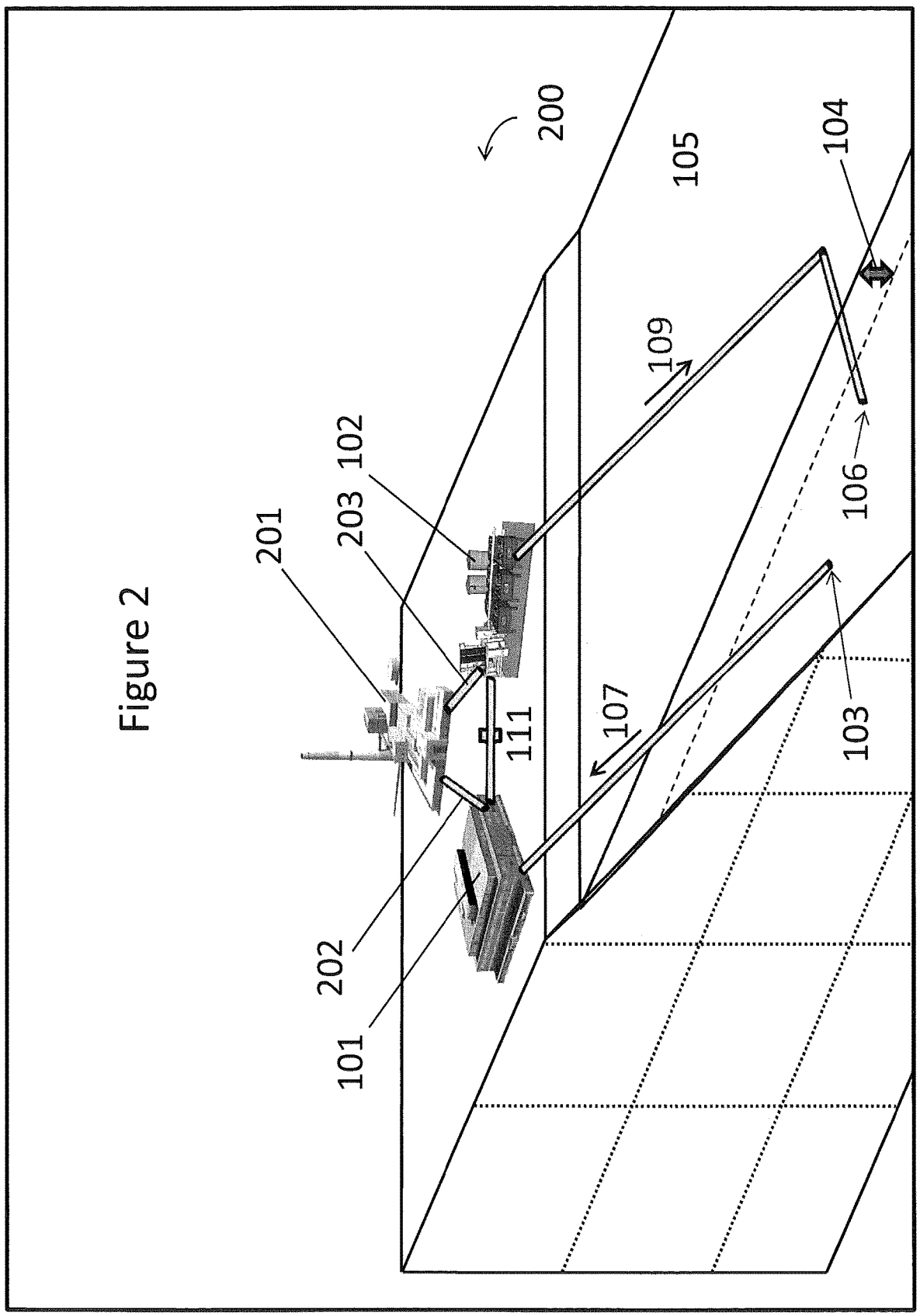
FIG. 2 is a diagram of a system including a data center, aquaculture center co-located with the data center and power plant co-located with the data center and aquaculture center, according to embodiments of the present disclosure.

In certain instances, and as depicted by the diagram of FIG. 2, a subject system 200 may include many of the same components and aspects illustrated in FIG. 1, including a data center 101, an aquaculture center 102 co-located with the data center, and may also include a power plant 201 co-located with the data center and the aquaculture center, operable connections 202, 203 (e.g., connections through which water may move and/or electric power may be transmitted) between the power plant, data center and/or aquaculture center, and other components and aspects described herein.

Various aspects of the embodiments of the systems shall now be described in greater detail below.

Data Center

Embodiments of the disclosed systems include one or more data centers. As used herein, the term "data center" refers to a facility configured and/or used for physically housing (i.e., containing within it) one or more computer systems and/or associated components. In certain embodiments, data centers include the components therein and manage, store, process and/or exchange digital information and data.

In particular aspects, data centers may include computers, data storage devices, servers (e.g., web servers, database servers and/or application servers), switches, routers, vaults, load balancers, racks, wire cages or closets and/or related equipment. Data centers may include redundant data communications connections, backup or redundant power supplies, security devices, and/or fire suppression systems. In some instances, data centers include data storage systems and/or telecommunications systems.

Some versions of data centers are used for providing application services or management for various types of data processing (e.g., intranet, web hosting internet). In particular embodiments, data centers are used, for example, to operate and manage one or more carriers' telecommunication network, provide data center applications directly to one or more carriers' customers and/or provide hosted applications for one or more third parties to provide services to customers.

Embodiments of data centers include data centers that are within one or more buildings. In certain aspects, data centers occupy one or more rooms of a building, one or more floors of a building or an entire building.

In some instances, data centers are electrically powered. For example, certain embodiments of data centers consume electricity to operate. Power draw for data centers may range from a few kW (e.g., one, two, three, four or five kW) to several tens of MW (e.g., one, two, three, four, five, six, seven, eight or nine tens of MW) for larger facilities. In select aspects of data centers, the data centers have power densities of more than one-hundred times that of an average office building. In some embodiments of data centers, electricity costs are the primary operating expense of the data center and may account for 10% or more of a data center's total cost of ownership.

Embodiments of data centers are operably connected to at least one power source (e.g., one or more power plants, as described herein). Certain versions of data centers include a power source (e.g., a source from which electrical power may be obtained). Power sources, in some embodiments, generate or obtain power from renewable energy sources. Renewable energy sources include, for example, one or more systems or devices configured to convert one or more forms of energy (e.g., solar, wind, wave, biofuel, biomass, tidal and/or geothermal energy) to another form (e.g., electric power). For example, a power source may be one or more solar panels.

In certain embodiments, data centers use an amount of energy for each function performed by the data center or components thereof. For example, data centers or systems including data centers may use a specific amount of energy per amount of data center cooling. In some aspects, data centers or systems including data centers have a degree of energy efficiency that may be quantified as the power usage effectiveness (PUE) of the data center or system including a data center (e.g., a PUE of 1.0; 1.1; 1.2; 1.3; 1.4; 1.5; 1.6; 1.7; 1.8; 1.9; or 2.0). The PUE is the ratio of the total power entering a system (e.g., a data center and optionally, a desalination plant and/or a data center power source, such as a power plant) to the power used by the computer systems and/or associated components (e.g., information technology equipment) within the system (e.g., the data center). In various aspects, a PUE is the inverse of the data center infrastructure efficiency (DCiE). In some versions, systems (e.g., data centers) have a PUE of 2.0 or less, such as 1.9 or less, e.g., 1.8, 1.7, 1.6, 1.5, 1.4, 1.3, 1.2 or 1.1 or less (e.g., a PUE ranging from 1.0 to 2.0). In some embodiments, a system (e.g., a data center) has a PUE ranging from 1.0 to 1.3. In some instances, a system, (e.g., a data center) has a PUE of or about 1.0, where a PUE of or about 1.0 is a PUE near, and greater than, 1.0 (e.g., 1.01 or 1.02 or 1.03 or 1.04 or 1.05 or 1.06 or 1.07 or 1.08 or 1.09 or 1.1 or 1.15 or 1.2 or 1.25 or 1.3 and/or within the range 1.01 to 1.30). In determining the PUE of data centers of the invention, one may factor in a component that represents the reduced energy used by the desalination plant in desalinating the warm water output of the data center cooling subsystem. Any convenient protocol for factoring in this component into the PUE determination may be employed. For example, the reduction in energy used by the desalination plant resulting from co-location of the desalination plant with the data center (and particularly by using the warm output warm water from the data center) may be added to the amount of energy input into the data center which is used by the computer systems and/or associated components (e.g., information technology equipment).

In some embodiments, data centers and/or power sources of data centers produce carbon emissions. In certain aspects, data centers (e.g., data centers operating independently) produce an amount of carbon emissions for each function or portion of a function performed by the data center or components thereof.

Data centers, in certain instances, produce heat. As such, certain versions of data centers include environmental control systems (e.g., one or more air conditioning units) for controlling at least a portion of the environment with a data center. In some aspects, environmental control systems include the water cooling subsystems described herein. In some aspects, environmental control systems include temperature control systems that are configured to heat and/or cool at least a portion of the data centers. In some instances, environmental control systems include humidity control systems that are configured to control the amount of humidity in at least a portion of the data centers. In some aspects, environmental control systems include pressure control systems that are configured to control the pressure level in at least a portion of the data centers. Some versions of environmental control systems are configured to maintain at least a portion of a data center and/or computer related equipment therein at a temperature between 16° C. and 24° C. (e.g., 17° C.; 18° C.; 19° C.; 20° C.; 21° C.; 22° C. or 23° C.) and/or within a humidity range of 40%-55% and/or with a maximum dew point of 15° C.

In various instances, and as noted above, data centers include one or more water cooling subsystems. The phrases "water cooling subsystem" and "water cooling subsystems", as used herein, refer to an interconnected structure located at least partially within a data center that is configured to cool at least one component (e.g., a server) or portion (e.g., a room) of the data center. Where desired, the interconnected structure of a water cooling subsystem includes one or more components (e.g., pipes and/or containers) configured to carry water from one location (e.g., the location of the intake) to another location. In certain embodiments, water cooling subsystems include a warm water discharge and/or output. In some embodiments, water cooling subsystems are water-tight except for an intake for receiving water into the subsystems and warm water discharge and/or output for discharging water out of the subsystems. The water cooling subsystem, in select instances, may be configured to receive water (e.g., cool water) from an ocean and/or sea and/or river and/or lake and/or groundwater source and/or other water source. In some versions, the water cooling subsystem may be operably connected (e.g., in fluid communication with) an aquaculture center (e.g., a salt water aquaculture center) or a component thereof (e.g., a water temperature control subsystem).

The term "water", as used herein, refers to the chemical compound having the chemical formula $H_2O$. Water may also be salt water (e.g., seawater) and as such may include one or more components (e.g., salts) dissolved therein. Salt water (e.g., seawater) may have a salinity of about 3.5% (35 g/L, or 599 mM) (e.g., a salinity of 3.4% to 3.6% or 3.1% to 3.8%). Water may also be fresh water (i.e, water having a lower concentration of dissolved salts than salt water). Fresh water may be desalinated water. Naturally occurring fresh water may be found, for example in streams, ponds, rivers, icebergs, ice caps, glaciers, aquifers, and/or lakes. Fresh water does not include seawater or brackish water (i.e., water having more salinity than fresh water but not as much salinity as seawater). Fresh water may have a dissolved salt concentration of, for example, less than 0.05%; brackish water may have a dissolved salt concentration between, for example, 0.05% to 3%; saline water (e.g., seawater) may have a dissolved salt concentration between, for example, 3%-5%; and brine may have a dissolved salt concentration of, for example, greater than 5%. Water may also be in the form of a liquid and/or gas.

Water, as described in the application, may also have a variety of different temperatures. By "cool" water, as used herein, is meant water that has a lower temperature than "warm" water, as described herein. In some aspects the temperature of cool water is within the range 1° C. to 35° C. For example, in some instances the temperature of cool water is within one of the following ranges: 1° C. to 10° C.; 11° C. to 20° C.; 21° C. to 30° C.; 31° C. to 35° C.; 12° C. to 19° C.; 13° C. to 18° C.; 14° C. to 17° C.; 15° C. to 16° C.; 1° C. to 20° C.; 2° C. to 19° C.; 3° C. to 18° C.; 4° C. to 17° C.; 5° C. to 16° C.; 6° C. to 15° C.; 7° C. to 14° C.; 7° C. to 13° C.; 8° C. to 12° C.; or 9° C. to 11° C. In particular aspects, the temperature difference between cool water and warm water may range from 1° C. to 99° C. For example, the temperature difference between cool water and warm water may be 1° C.; 2° C.; 3° C.; 4° C.; 5° C.; 6° C.; 7° C.; 8° C.; 9° C.; 10° C.; 11° C.; 12° C.; 13° C.; 14° C.; 15° C.; 16° C.; 17° C.; 18° C.; 19° C.; 20° C.; 21° C. 22° C.; 23° C.; 24° C.; 25° C.; 26° C.; 27° C.; 28° C.; 29° C.; 30° C.; 31° C. 32° C.; 33° C.; 34° C.; 35° C.; 36° C.; 37° C.; 38° C.; 39° C.; 40° C.; 41° C. 42° C.; 43° C.; 44° C.; 45° C.; 46° C.; 47° C.; 48° C.; 49° C.; 50° C.; 51° C. 52° C.; 53° C.; 54° C.; 55° C.; 56° C.; 57° C.; 58° C.; 59° C.; 60° C.; 61° C. 62° C.; 63° C.; 64° C.; 65° C.; 66° C.; 67° C.; 68° C.; 69° C.; 70° C.; 71° C. 72° C.; 73° C.; 74° C.; 75° C.; 76° C.; 77° C.; 78° C.; 79° C.; 80° C.; 81° C. 82° C.; 83° C.; 84° C.; 85° C.; 86° C.; 87° C.; 88° C.; 89° C.; 90° C.; 91° C.; 92° C.; 93° C.; 94° C.; 95° C.; 96° C.; 97° C.; 98° C.; or 99° C. The temperature difference between cool water and warm water may also be, for example, at least 1° C.; at least 2° C.; at least 3° C.; at least 4° C.; at least 5° C.; at least 10° C.; at least 15° C.; at least 20° C.; at least 25° C.; at least 30° C.; at least 35° C.; at least 40° C.; or at least 50° C. In some aspects, cool water may have a temperature within one of the above listed ranges when the cool water enters and/or exits a component of the systems described herein (e.g., the water intake). In some aspects, cool water may have the same temperature as the water source from which the cool water is taken. For example, cool water may have the same temperature as that of the portion of ocean or sea surrounding (e.g., a location at or within a distance of 1 m and/or 10 m and/or 100 m and/or 1000 m) one or more elements of the system disclosed herein (e.g., a water intake and/or a water discharge). In certain aspects of the disclosed systems, the cool water is received into the systems from an ocean or sea. In some instances, the temperature of cool water increases and/or decreases as the water progresses through the disclosed systems.

By "warm" water, as used herein, is meant water that has a higher temperature than "cool" water, as described herein. In some aspects the temperature of warm water is within the range 36° C. to 100° C. For example, in some instances the temperature of warm water is within one of the following ranges: 36° C. to 40° C.; 41° C. to 50° C.; 51° C. to 60° C.; 61° C. to 70° C.; 71° C. to 80° C.; 81° C. to 90° C.; 91° C. to 99° C.; 40° C. to 45° C.; 46° C. to 50° C.; 51° C. to 55° C.; 56° C. to 60° C.; 61° C. to 65° C.; 66° C. to 70° C.; 36° C. to 60° C.; 37° C. to 59° C.; 38° C. to 58° C.; 39° C. to 57° C.; 40° C. to 56° C.; 41° C. to 55° C.; 42° C. to 54° C.; 43° C. to 53° C.; 44° C. to 52° C.; 45° C. to 51° C.; 46° C. to 50° C.; or 47° C. to 49° C. As noted above, in particular instances, the temperature difference between cool water and warm water may range from 1° C. to 99° C. For example, the temperature difference between cool water and warm water may be, at least 1° C.; at least 2° C.; at least 3° C.; at least 4° C.; at least 5° C.; at least 10° C.; at least 15° C.; at least 20° C.; at least 25° C.; at least 30° C.; at least 35° C.; at least 40° C.; or at least 50° C. In some aspects, warm water may have a temperature within one of the above listed ranges when the warm water enters and/or exits a component of the systems described herein (e.g., the water discharge). In some aspects, warm water may have a higher temperature than the water source from which the cool water is taken. For example, warm water may have a higher temperature than that of the portion of ocean or sea surrounding (e.g., a location at or within a distance of 1 m and/or 10 m and/or 100 m and/or 1000 m) one or more elements of the system disclosed herein (e.g., a water intake and/or a water discharge). In some embodiments, the temperature of warm water increases and/or decreases as the water progresses through the disclosed systems.

In some aspects, the water cooling subsystem may be configured to carry cool water to at least one location in a data center (e.g., a location where heat is produced by the data center) where the cool water is heated and thereby converted to warm water. Cool water may be heated and converted to warm water within a heat exchange element of a water cooling subsystem, which is described in further detail below. The water cooling subsystem may also, in some instances, be configured to carry warm water away from one location in a data center (e.g., the location of a heat exchange element) to another location (e.g., a location outside a portion of the data center which contains one or more computer systems and/or associated components). Where desired, the water cooling subsystem is configured to carry heat energy away from one or more computer systems and/or associated components that generate heat energy by allowing generated heat energy to be transferred to water (e.g. cool water) within the water cooling subsystem (e.g., within a heat exchange element of the water cooling subsystem) and thereafter, transferring the heated water (e.g., warm water) away from the position within the data center where it was heated. By transferring water within a data center and thereby cooling one or more computer systems and/or associated components within the data center, the water cooling subsystem optimizes the operation of the systems and/or components by providing an environment in which the systems and/or components may effectively operate.

In certain instances, water cooling subsystems include a heat exchange element. In particular embodiments, heat exchange elements are configured to cool one or more locations and/or components within a data center. For example, heat exchange elements may be configured to allow an exchange of heat produced by a data center at a first location to a medium (e.g., air and/or water) and thereafter transfer the heated medium to a second location so that the first location of the data center and/or components at the first location are cooled. In some aspects, heat exchange elements are configured such that a medium (e.g., cool water) may be channeled into the heat exchange element (e.g., from a first portion of the water cooling subsystem) and/or a medium (e.g., warm water) may be channeled out of the heat exchange element (e.g., to a second portion of the water cooling subsystem).

In select aspects, a heat exchange element is an air conditioning system (e.g., one or more air conditioning units). In some instances, heat exchange elements are configured to cool air around (e.g., in the same room of a data center as data center components) components (e.g., electrical components) of the data center which produce heat. In some instances, heat exchange elements are configured to allow the transfer of heat from air (e.g., air heated by data center components) around (e.g., in the same room of a data center as data center components) components (e.g., electrical components) of the data center which produce heat to cool water. Such an exchange will result in the air being cooled and the water being warmed (e.g., to warm water). Accordingly, in some aspects, cool water is heated to warm water within the heat exchange element. In certain instances, heat exchange elements are configured to remove air that has been heated by components of a data center from the area of the data center (e.g., room) in which the components are located.

In certain embodiments, heat exchange elements are one or more channels (e.g., channels having a large interior and/or exterior surface area) physically integrated with components of a data center (e.g., electronic components which produce heat). Where desired, heat exchange elements are configured such that water may flow through them and thereby transfer heat away from the data center components. In some versions, the heat exchange element is operably connected to the remainder of the water cooling subsystem at one or more locations (e.g., one, two, three, four or five locations). In select aspects, the heat exchange element is composed of the same materials as the remainder of the water cooling subsystem or different materials. Examples of heat exchange elements that may be utilized either wholly or partially in connection with the disclosed systems are provided by U.S. Pat. Nos. 6,374,627; 8,0094, 30; 7,525,207; 7,347,058; 8,004,832; 7,810,341; 7,808,780; 6,574,104; 6,859,366; 8,157,626; 7,881,057; 6,980,433; 6,945,058; 6,854,284; 6,834,512; 6,775,997; 6,772,604; 8,113,010; 8,276,397; U.S. patent application Ser. No. 12/531,215; U.S. patent application Ser. No. 13/372,100; U.S. patent application Ser. No. 12/844,658; U.S. patent application Ser. No. 12/873,909; U.S. patent application Ser. No. 12/264,648; and U.S. patent application Ser. No. 12/332,708, the disclosures of each which are incorporated by reference herein.

As noted above, in certain embodiments, water cooling subsystems include a warm water discharge and/or warm water output. In various instances, warm water discharges are operably connected (e.g., attached in a water-tight manner) to aquaculture centers (e.g., salt water aquaculture centers) and/or desalination plants and/or power plants. In some versions, warm water discharges are part of the same structure as the coupling components described herein. Where desired, warm water discharges expel warm water out of a water cooling subsystem and/or into a water source or body of water. In select embodiments, warm water discharges include one or more openings through which warm water may move (e.g., flow). In certain embodiments, a warm water discharge is a pipe and may be made of the same and/or different materials and/or types of materials as the water intakes described herein. In certain versions, a warm water discharge is positioned inside or outside a portion of the data center which contains one or more computer systems and/or associated components. The water cooling subsystem, in certain embodiments, includes a water intake. In some aspects, the water intake includes one or more openings (e.g., holes, gaps and/or slits) in the water cooling system configured to receive water (e.g., cool water) into the water cooling subsystem. For example, the water intake may be one or more pipes having one or more (i.e., one, two, three, four, five, six, seven, eight, nine, or ten or more) openings (e.g., an open end) positioned within a body of water such that water may flow into the one or more pipes. In some embodiments, a water intake or an opening therein is shaped as a circle, rectangle, square, slit, polygon, quadrilateral, oval, semi-circle, or other shape. In select instances, a water intake or an opening therein may have a single defined radius of symmetry. In some versions, a water intake or an opening therein may have radii of curvature lying within a single plane (e.g., a vertical plane or a horizontal plane).

In certain embodiments, water intakes (e.g., one or more openings in water intakes) are configured to intake or otherwise have an amount of water (e.g., seawater) move through them in a set time period (e.g., a minute or hour or day). For example, water intakes may be configured to intake up to: 5,000 L/day; 10,000 L/day; 15,000 L/day; 20,000 L/day; 25,000 L/day; 30,000 L/day; 35,000 L/day; 40,000 L/day; 45,000 L/day; 50,000 L/day; 55,000 L/day; 60,000 L/day; 65,000 L/day; 70,000 L/day; 75,000 L/day; 80,000 L/day; 85,000 L/day; 90,000 L/day; 95,000 L/day; 100,000 L/day; 150,000 L/day; 200,000 L/day; 250,000 L/day; 300,000 L/day; 350,000 L/day; 400,000 L/day; 450,000 L/day; 500,000 L/day; 550,000 L/day; 600,000 L/day; 650,000 L/day; 700,000 L/day; 750,000 L/day; 800,000 L/day; 850,000 L/day; 900,000 L/day; 950,000 L/day; 1 million L/day; 5 million L/day; 10 million L/day; 20 million L/day; 30 million L/day; 40 million L/day; 50 million L/day; 60 million L/day; 70 million L/day; 80 million L/day; 90 million L/day; 100 million L/day; 110 million L/day; 120 million L/day; 130 million L/day; 140 million L/day; 150 million L/day; 160 million L/day; 170 million L/day; 180 million L/day; 190 million L/day; 200 million L/day; 220 million L/day; 240 million L/day; 260 million L/day; 280 million L/day; 300 million L/day; 400 million L/day; 500 million L/day; or 1 billion L/day. Water intakes may also be configured to intake more than 1 billion L/day. Water intakes, in particular embodiments, may be configured to intake an amount of water in any of the ranges: 5,000 L/day to 1 billion L/day; 5,000 L/day to 1 million L/day; 5,000 L/day to 100 million L/day; 5,000 L/day to 20,000 L/day; 20,000 L/day to 40,000 L/day; 40,000 L/day to 60,000 L/day; 60,000 L/day to 80,000 L/day; 80,000 L/day to 100,000 L/day; 100,000 L/day to 120,000 L/day; 120,000 L/day to 140,000 L/day; 140,000 L/day to 160,000 L/day; 160,000 L/day to 180,000 L/day; 180,000 L/day to 200,000 L/day; 200,000 L/day to 250,000 L/day; 250,000 L/day to 300,000 L/day; 3000,000 L/day to 350,000 L/day; 100,000 L/day to 200,000 L/day; 200,000 L/day to 300,000 L/day; 300,000 L/day to 400,000 L/day; 400,000 L/day to 500,000 L/day; 500,000 L/day to 600,000 L/day; 600,000 L/day to 700,000 L/day; 700,000 L/day to 800,000 L/day; 800,000 L/day to 900,000 L/day; 900,000 L/day to 1 million L/day; 1 million L/day to 20 million L/day; 20 million L/day to 40 million L/day; 40 million L/day to 60 million L/day; 60 million L/day to 80 million L/day; or 80 million L/day to 100 million L/day. In some aspects, intakes are configured such that the amount of water moving (e.g., flowing) through an intake may be variable within a time period (e.g., one minute, one hour, one day, one month, one year).

In particular aspects, the water intake or a portion thereof is positioned outside the portion of the data center containing the one or more computer systems and/or associated components. For example, in some variations, the water intake is positioned outside the building housing the one or more computer systems and/or associated components. Where desired, the intake is in fluid communication with at least one portion of the water cooling subsystem located inside the portion of the data center containing the one or more computer systems and/or associated components wherein cool water is heated (e.g., heated to warm water).

Embodiments of the water cooling subsystems include a water intake positioned at a depth of 15 m or more, e.g., 20 m or more, 25 m or more, 30 m or more, 35 m or more, in a water source. Some variations of the water cooling subsystems include a water intake and/or at least one opening therein (e.g., an opening at the end of the intake furthest from the portion of the data center housing computer systems and related components) positioned at a depth of 1 m or more; 2 m or more; 3 m or more; 4 m or more; 5 m or more; 6 m or more; 7 m or more; 8 m or more; 9 m or more; 10 m or more; 11 m or more; 12 m or more; 13 m or more; 14 m or more; 16 m or more; 17 m or more; 18 m or more; 19 m or more; 20 m or more; 25 m or more; 30 m or more; 35 m or more; 40 m or more; 45 m or more; 50 m or more; 60 m or more; 70 m or more; 80 m or more; 90 m or more; 100 m or more; 200 m or more; and/or 300 m or more in a water source. In some aspects, water cooling subsystems include a water intake and/or at least one opening therein positioned below and/or within a particular zone (e.g., euphotic and/or disphotic, and/or aphotic zone and/or benthic zone) in a water source. Water cooling subsystems, in select versions, include a water intake and/or at least one opening therein positioned below the photic zone in a water source.

Embodiments of water cooling subsystems, and in certain versions water intakes, include one or more filters configured for purifying water. In select instances, at least one filter is located at one or more openings in the intake and/or at the end of the intake furthest from the portion of the data center housing the computer systems and/or related equipment. Where desired, a filter is positioned within the portion of the data center housing the computer systems and/or related equipment.

Water cooling subsystems and/or water intakes thereof may, in various embodiments, be composed of one or more materials or one or more types of materials. Examples of materials that the water cooling subsystems of the disclosed systems may be composed of include polymers, ceramics, metals, glasses and/or a combination thereof. In some instances, the water cooling subsystems are not composed of metal or material that is subject to corrosion (e.g., corrosion by rust). In some embodiments, water cooling subsystems are composed of plumbing materials. For example, water cooling subsystems may be composed of polyvinyl chloride (PVC) pipes and/or joints and one or more adhesives for fastening the pipes in a water-tight manner. Where appropriate, one or more materials of the water cooling subsystems may be rigid. In some aspects, one or more materials of the water cooling subsystems may be flexible (e.g., one or more rubber tubes or hoses). However, these examples of materials are not limiting and the materials of the water cooling subsystems may be any material, or combination of materials, having the structural and chemical properties necessary to function in the disclosed systems as described herein.

The water cooling subsystem, in various instances, includes a pump. In some embodiments, a pump is a means for causing water to move through water cooling subsystems and/or other components (e.g., water intakes; water discharges and/or desalination plants), as described herein. In select variations, a pump causes water to move unidirectionally or bidirectionally through water cooling subsystems and/or other components (e.g., water intakes; water discharges and/or desalination plants), as described herein. In some instances, a pump is electrically powered and/or fossil fuel powered and/or powered by another means. In certain aspects, a pump is operably connected to a power source (i.e., the power source of the data center), as described herein. In some aspects, a pump may be operably connected to a power plant. In particular versions, tides, and/or a pump powered by tides, cause water to move through the water cooling subsystems and/or other components (i.e., desalination plants) described herein. In some embodiments, one or more pumps are located within data centers and/or desalination plants, as described herein. In select embodiments, one or more pumps are located outside data centers and/or desalination plants, as described herein.

In particular aspects, water cooling subsystems include one or more valves within the subsystems for controlling the movement of water through the system. In some embodiments, the valves are controllable (e.g., configured to be opened and/or closed in reaction to a designated signal or action). Where desired, each valve is individually controllable (e.g., a valve may be opened and or closed while other valves are not). In select embodiments, the one or more valves include electrical components and may be configured to receive an electronic signal from a controller operably connected thereto.

Aquaculture Center

Embodiments of the disclosed systems include one or more aquaculture centers. As noted above, the term "aquaculture center", as used herein, is meant a facility configured and/or used for cultivating (i.e., farming) aquatic organisms. Aquatic organisms cultivated in aquaculture centers may be grown entirely in, on or near water. In certain embodiments, aquaculture centers house components configured to control conditions important to the cultivation of aquatic organisms (e.g., water temperature, pH, oxygenation, organic waste concentration, bacterial concentration, etc.).

Conditions important to the cultivation of aquatic organisms may be different for different types of organisms. For example, certain types of fish thrive (e.g., have a higher survival rate and/or proliferate more successfully) when they are in water of a certain temperature. In some instances, retaining aquatic organisms (e.g., fish) in water at a warmer temperature (e.g., a water temperature higher than the organism's natural water temperature) allow them to breed year-round and as such, cause the organisms to proliferate more successfully.

General ranges of water temperatures optimal for "coldwater" species of fish are temperatures between about 12° C. and 18° C. "Coldwater" species of fish include, for example, all species of salmon and trout. Likewise, general ranges of water temperatures optimal for "coolwater" species of fish are temperatures between about 18° C. and 24° C. "Coolwater" species of fish include, for example, walleye and yellow perch. In addition, general ranges of water temperatures optimal for "warmwater" species of fish are temperatures between about 24° C. and 33° C. "Warmwater" species of fish include, for example, channel catfish and tilapia.

Aquatic organisms cultivated in aquaculture centers may include, for example, fish, crustaceans, mollusks, and/or aquatic plants. Types of fish cultivated in aquaculture centers may include, for example, carp, salmon, tilapia, tuna (e.g., Bluefin tuna; coax tuna), bass (e.g., sea bass, such as Black sea bass), halibut (e.g., Alaskan halibut; Pacific halibut) and catfish. Types of fish cultivated in aquaculture centers may include, for example, only certain types of organisms (e.g., fish), such as only halibut (e.g., only Alaskan halibut) or only bass (e.g., only sea bass) or only halibut (Alaskan halibut) and bass (sea bass). Optimal water temperatures (e.g., water temperatures allowing successful proliferation) for halibut (e.g., Alaskan halibut; Pacific halibut) range from about 3° C. to 8° C. Optimal water temperatures (e.g., water temperatures allowing successful proliferation) for bass (e.g., sea bass) range from about 10° C. to 29° C.

Aquatic plants cultivated in aquaculture centers may include, for example, microalgae (i.e., phytoplankton, microphytes, or planktonic algae) or macroalgae (i.e., seaweed). Aquatic organisms may also include sponges (e.g., sea sponges). Types of crustaceans cultivated in aquaculture centers may include, for example, shrimp (e.g., Pacific white shrimp; giant tiger prawn; giant river prawn), lobster or crabs. Mollusks cultivated in aquaculture centers may include, for example, various oyster, clam or mussel species (e.g., abalone).

Aquatic organisms cultured in aquaculture centers may be those that are adapted to live only in salt water and/or fresh water. Aquaculture centers, in certain embodiments, are adapted to have organisms cultivated therein that are adapted to live in salt water. Such aquaculture centers are referred to herein as "salt water aquaculture centers". Aquaculture centers, in certain embodiments, are be adapted to have organisms cultivated therein that are adapted to live in fresh water. Such aquaculture centers are referred to herein as "fresh water aquaculture centers". Aquaculture centers, in various aspects, may be both "salt water aquaculture centers" and "fresh water aquaculture centers".

Aquaculture centers, in various embodiments, include one or more tanks or containers for holding one or more aquatic organisms or types of organisms and water. Such tanks may be operably connected (e.g., in fluid communication) to one another and/or to components for controlling conditions therein. Such tanks may also be operably connected to a water source (e.g., a warm water discharge of a water cooling subsystem of a data center) such that water may move into the tanks from the water source. In particular aspects, tanks in aquaculture centers and water therein may be separated from a water source in such a manner that aquatic organisms are prevented from moving from the tanks into the water source and/or from the water source into the tanks. As such, aquaculture centers may be located inland (e.g., have one or more tanks constructed on a body of land that is not located under a depth of water) from a body of water such as an ocean or sea.

In various embodiments, aquaculture centers are "recirculating aquaculture systems" (RAS). RAS systems recycle water therein by circulating it through filters to remove waste (e.g., fish waste and/or food) and then recirculate the water back into tanks in which aquatic organisms are cultivated.

As noted above, in various embodiments, aquaculture centers house components configured to control conditions important to the cultivation of aquatic organisms. Conditions important to the cultivation of aquatic organisms include, for example, water temperature, oxygenation, illumination, pH, bacterial concentration in water and/or concentration of organic waste in water.

In some embodiments, the aquaculture centers described herein include water temperature control subsystems. The phrases "water temperature control subsystem" and "water temperature control subsystems", as used herein, refer to an interconnected structure located at least partially within an aquaculture center that is configured to heat and/or cool at least one component or portion (e.g., a tank and/or water therein) of the aquaculture center. Where desired, the interconnected structure of a water temperature control subsystem includes one or more components (e.g., pipes and/or containers and/or tanks) configured to carry water from one location (e.g., the location of the intake) to another location. In certain embodiments, water temperature control subsystems include a water discharge and/or output. The water temperature control subsystem, in select instances, may be configured to receive water (e.g., warm water) from a water cooling subsystem of a data center and/or an ocean and/or sea (e.g., a salt water aquaculture center) and/or river and/or lake (e.g., a fresh water aquaculture center) and/or groundwater source and/or other water source.

Water temperature control subsystems, in some aspects, may be configured to maintain one or more water temperatures within an aquaculture center (e.g., a temperature between 12° C. and 18° C.; 18° C. and 24° C.; or 24° C. and 33° C.). As such, water temperature control subsystems may be configured to heat and/or cool water within aquaculture centers. In some embodiments, water temperature control subsystems include one or more heating elements for heating water. In some embodiments, water temperature control subsystems include one or more cooling elements for cooling water.

Water temperature control subsystems, in certain embodiments, include one or more tanks or compartments within an aquaculture center configured for holding one or more aquatic organisms or types of organisms and water. In some embodiments, one or more tanks within an aquaculture center are operably coupled to one or more heating elements for heating water therein.

As noted above, in certain embodiments, water temperature control subsystems include a water discharge and/or water output. In various instances, water discharges are operably connected (e.g., attached in a water-tight manner) to desalination plants and/or power plants. In some versions, water discharges are part of the same structure as the coupling components described herein. Where desired, water discharges expel water (e.g., cool water and/or warm water) out of a water temperature control subsystem and/or into a water source or body of water. In select embodiments, water discharges include one or more openings through which warm and/or cool water may move (e.g., flow). In certain embodiments, a water discharge is a pipe and may be made of the same and/or different materials and/or types of materials as the water intakes described herein. In certain versions, a water discharge is positioned inside or outside a portion of the aquaculture center which contains one or more tanks wherein aquatic organisms are cultured.

The water temperature control subsystem, in certain embodiments, includes a water intake. In some aspects, the water intake includes one or more openings (e.g., holes, gaps and/or slits) in the water temperature control subsystem configured to receive water (e.g., cool water) into the water temperature control subsystem. For example, the water intake may be one or more pipes having one or more (i.e., one, two, three, four, five, six, seven, eight, nine, or ten or more) openings (e.g., an open end) positioned within a body of water such that water may flow into the one or more pipes. In some embodiments, a water intake or an opening therein is shaped as a circle, rectangle, square, slit, polygon, quadrilateral, oval, semi-circle, or other shape. In select instances, a water intake or an opening therein may have a single defined radius of symmetry. In some versions, a water intake or an opening therein may include radii of curvature lying within a single plane (e.g., a vertical plane or a horizontal plane).

In certain embodiments, water intakes (e.g., one or more openings in water intakes) are configured to intake or otherwise have an amount of water (e.g., seawater) move through them in a set time period (e.g., a minute or hour or day). For example, water intakes may be configured to intake up to: 500 L/day; 1,000 L/day; 5,000 L/day; 10,000 L/day; 15,000 L/day; 20,000 L/day; 25,000 L/day; 30,000 L/day; 35,000 L/day; 40,000 L/day; 45,000 L/day; 50,000 L/day; 55,000 L/day; 60,000 L/day; 65,000 L/day; 70,000 L/day; 75,000 L/day; 80,000 L/day; 85,000 L/day; 90,000 L/day; 95,000 L/day; 100,000 L/day; 150,000 L/day; 200,000 L/day; 250,000 L/day; 300,000 L/day; 350,000 L/day; 400,000 L/day; 450,000 L/day; 500,000 L/day; 550,000 L/day; 600,000 L/day; 650,000 L/day; 700,000 L/day; 750,000 L/day; 800,000 L/day; 850,000 L/day; 900,000 L/day; 950,000 L/day; 1 million L/day; 5 million L/day; 10 million L/day; 20 million L/day; 30 million L/day; 40 million L/day; 50 million L/day; 60 million L/day; 70 million L/day; 80 million L/day; 90 million L/day; 100 million L/day; 110 million L/day; 120 million L/day; 130 million L/day; 140 million L/day; 150 million L/day; 160 million L/day; 170 million L/day; 180 million L/day; 190 million L/day; 200 million L/day; 220 million L/day; 240 million L/day; 260 million L/day; 280 million L/day; 300 million L/day; 400 million L/day; 500 million L/day; or 1 billion L/day. Water intakes may also be configured to intake more than 1 billion L/day. Water intakes, in particular embodiments, may be configured to intake an amount of water in any of the ranges: 5,000 L/day to 1 billion L/day; 5,000 L/day to 1 million L/day; 5,000 L/day to 100 million L/day; 5,000 L/day to 20,000 L/day; 20,000 L/day to 40,000 L/day; 40,000 L/day to 60,000 L/day; 60,000 L/day to 80,000 L/day; 80,000 L/day to 100,000 L/day; 100,000 L/day to 120,000 L/day; 120,000 L/day to 140,000 L/day; 140,000 L/day to 160,000 L/day; 160,000 L/day to 180,000 L/day; 180,000 L/day to 200,000 L/day; 200,000 L/day to 250,000 L/day; 250,000 L/day to 300,000 L/day; 3000,000 L/day to 350,000 L/day; 100,000 L/day to 200,000 L/day; 200,000 L/day to 300,000 L/day; 300,000 L/day to 400,000 L/day; 400,000 L/day to 500,000 L/day; 500,000 L/day to 600,000 L/day; 600,000 L/day to 700,000 L/day; 700,000 L/day to 800,000 L/day; 800,000 L/day to 900,000 L/day; 900,000 L/day to 1 million L/day; 1 million L/day to 20 million L/day; 20 million L/day to 40 million L/day; 40 million L/day to 60 million L/day; 60 million L/day to 80 million L/day; or 80 million L/day to 100 million L/day. In some aspects, intakes are configured such that the amount of water moving (e.g., flowing) through an intake may be variable within a time period (e.g., one minute, one hour, one day, one month, one year).

In some aspects, the water intake or a portion thereof is positioned outside the portion of the aquaculture center containing one or more tanks wherein one or more aquatic organisms are cultured. For example, in some variations, the water intake is positioned outside the building housing the one or more tanks and/or associated components. Where desired, the intake is operably connected to (e.g., in fluid communication with) at least one portion of the water cooling subsystem (e.g., a portion located inside the portion a data center wherein cool water is heated, for instance, to warm water). In some aspects, the intake is configured to receive water (e.g., warm water) from a water cooling subsystem of a data center.

Embodiments of the water temperature control subsystems include a water intake positioned at a depth of 15 m or more in a water source. Some variations of the water temperature control subsystems include a water intake and/or at least one opening therein (e.g., an opening at the end of the intake furthest from the portion of the data center housing computer systems and related components) positioned at a depth of 1 m or more; 2 m or more; 3 m or more; 4 m or more; 5 m or more; 6 m or more; 7 m or more; 8 m or more; 9 m or more; 10 m or more; 11 m or more; 12 m or more; 13 m or more; 14 m or more; 16 m or more; 17 m or more; 18 m or more; 19 m or more; 20 m or more; 25 m or more; 30 m or more; 35 m or more; 40 m or more; 45 m or more; 50 m or more; 60 m or more; 70 m or more; 80 m or more; 90 m or more; 100 m or more; 200 m or more; and/or 300 m or more in a water source. In some aspects, water temperature control subsystems include a water intake and/or at least one opening therein positioned below and/or within a particular zone (e.g., euphotic and/or disphotic, and/or aphotic zone and/or benthic zone) in a water source. Water temperature control subsystems, in select versions, include a water intake and/or at least one opening therein positioned below the photic zone in a water source.

In certain aspects wherein a water intake is positioned at a particular depth within a water source (e.g., a depth of 15 m or more), its center (e.g., the center-most point of a water intake) and/or the top edge (e.g., the edge or portion closest to the surface of the water) of the water intake and/or the bottom edge (e.g., the edge or portion furthest from the surface of the water) of the water intake is positioned at that particular depth below the surface of the water. In certain instances, a water intake positioned at a particular depth within a water source may have an opening wherein the center of the opening (e.g., the center-most point of a circular and/or square opening) and/or the top edge (e.g., the edge or portion closest to the surface of the water) of the opening and/or the bottom edge (e.g., the edge or portion furthest from the surface of the water) of the opening is positioned at that particular depth below the surface of the water.

Embodiments of aquaculture centers, and in some embodiments, water temperature control subsystems, and in certain versions water intakes, include one or more filters configured for purifying water (e.g., removing organic contaminates therefrom and/or providing water having a sufficient purity to encourage proliferation of aquatic organisms therein). In select instances, at least one filter is located at one or more openings in the intake and/or at the end of the intake furthest from the portion of the aquaculture center housing the one or more tanks wherein aquatic organisms are cultured. In some aspects, water in the water temperature control subsystems is circulated (e.g., circulated repeatedly) through at least one filter to provide healthy living conditions for aquatic organisms therein (e.g., to provide conditions to maximize the proliferation of aquatic organisms therein).

Water temperature control subsystems and/or water intakes thereof may, in various aspects, be composed of one or more materials or one or more types of materials. Examples of materials that the water temperature control subsystems of the disclosed systems may be composed of include polymers, ceramics, metals, glasses and/or a combination thereof. In some instances, the water temperature control subsystems are not composed of metal or material that is subject to corrosion (e.g., corrosion by rust). In some embodiments, water temperature control subsystems are composed of plumbing materials. For example, water temperature control subsystems may be composed of polyvinyl chloride (PVC) pipes and/or joints and one or more adhesives for fastening the pipes in a water-tight manner. Where appropriate, one or more materials of the water temperature control subsystems may be rigid. In some aspects, one or more materials of the water temperature control subsystems may be flexible (e.g., one or more rubber tubes or hoses). However, these examples of materials are not limiting and the materials of the water temperature control subsystems may be any material, or combination of materials, having the structural and chemical properties necessary to function in the disclosed systems as described herein.

The water temperature control subsystem, in various instances, includes a pump. In some embodiments, a pump is a means for causing water to move through water temperature control subsystems and/or other components (e.g., water intakes; water discharges and/or desalination plants), as described herein. In select variations, a pump causes water to move unidirectionally or bidirectionally through water temperature control subsystems and/or other components (e.g., water intakes; water discharges and/or desalination plants), as described herein. In some instances, a pump is electrically powered and/or fossil fuel powered and/or powered by another means. In certain aspects, a pump is operably connected to a power source (i.e., the power source of the aquaculture center), as described herein. In some aspects, a pump may be operably connected to a power plant. In particular versions, tides, and/or a pump powered by tides, cause water to move through the water temperature control subsystems and/or other components (i.e., desalination plants) described herein. In some embodiments, one or more pumps are located within data centers/and or aquaculture centers and/or desalination plants, as described herein. In select embodiments, one or more pumps are located outside data centers and/or aquaculture centers and/or desalination plants, as described herein.

In particular aspects, water temperature control subsystems include one or more valves within the subsystems for controlling the movement of water and/or aquatic organisms through the system. In some embodiments, the valves are controllable (e.g., configured to be opened and/or closed in reaction to a designated signal or action). Where desired, each valve is individually controllable (e.g., a valve may be opened and or closed while other valves are not). In select embodiments, the one or more valves include electrical components and may be configured to receive an electronic signal from a controller operably connected thereto.

In some instances, aquaculture centers and/or the components therein (e.g., a heating element) are electrically powered. For example, certain embodiments of aquaculture centers consume electricity to operate. Embodiments of aquaculture centers are operably connected to at least one power source (e.g., one or more power plants, as described herein). Certain versions of data centers include a power source (e.g., a source from which electrical power may be obtained). Power sources, in some embodiments, generate or obtain power from renewable energy sources. Renewable energy sources include, for example, one or more systems or devices configured to convert one or more forms of energy (e.g., solar, wind, wave, biofuel, biomass, tidal and/or geothermal energy) to another form (e.g., electric power). For example, a power source may be one or more solar panels.

In certain embodiments, aquaculture centers use an amount of energy for each function performed (e.g., each volume of water heated) by the aquaculture center or components thereof. For example, aquaculture centers or systems including aquaculture centers and other facilities (e.g., data centers) may use a specific amount of energy per volume of aquatic organisms cultured. As such, in some aspects, aquaculture centers or systems including aquaculture centers and other facilities (e.g., data centers) have a degree of energy efficiency that may be quantified. In some aspects, the degree of energy efficiency of aquaculture centers or systems including aquaculture centers and other facilities (e.g., data centers) is improved (i.e., the system uses less overall energy) by co-locating an aquaculture center with other systems described herein (e.g., a desalination plant and/or a power plant and/or a data center).

In some embodiments, aquaculture centers and/or power sources of aquaculture centers produce carbon emissions. In certain aspects, aquaculture centers (e.g., aquaculture centers operating independently) produce an amount of carbon emissions for each function or portion of a function performed by the aquaculture center or components thereof. In various aspects, systems including aquaculture centers and other facilities (e.g., data centers) produce fewer carbon emissions than the same aquaculture center and other facility (e.g., data center) operating independently (e.g., not operably connected).

As noted above, in various aspects of the disclosed systems, aquaculture centers may be operably coupled (e.g., placed in fluid communication with) to data centers. As such, in particular aspects, aquaculture centers may be configured to receive warm water from data centers as described herein. In such embodiments of aquaculture centers, water received into an aquaculture center (e.g., a salt water aquaculture center) from a data center may be directed to flow into tanks wherein aquatic organisms are cultured. In such embodiments, water flowing into an intake of an aquaculture center is warm water from a data center.

Embodiments of the disclosed systems, including aquaculture centers operably coupled (e.g., placed in fluid communication with) to data centers such that warm water may flow from a data center to an aquaculture center, are more energy efficient (e.g., use less energy) and/or produce fewer carbon emissions that the same desalination plant and data center operating independently.

Water Discharge

In some embodiments, the disclosed systems include a water discharge. In various aspects, the water discharge is configured for discharging brine from the disclosed systems. Where appropriate, the water discharge includes one or more openings (e.g., holes, gaps and/or slits) in the portions of the system configured for transporting water and/or brine. For example, the water discharge may be one or more pipes having at least one opening (e.g., an open end) positioned within a body of water such that water and/or brine may flow out of the one or more pipes. In some variations, a water discharge or an opening therein is shaped as a circle, rectangle, square, slit, polygon, quadrilateral, oval, semicircle, or other shape. In some instances, the water discharge includes a diffuser or analogous structure. Where desired, a water discharge or an opening therein may have a single defined radius of symmetry. In some aspects, a water discharge or an opening therein may have radii of curvature lying within a single plane (e.g., a vertical plane or a horizontal plane).

In certain embodiments, water discharges (e.g., one or more openings in water discharges) are configured to discharge or otherwise have an amount of water (e.g., seawater) move through them in a set time period (e.g., a minute or hour or day). For example, water discharges may be configured to discharge up to: 5,000 L/day; 10,000 L/day; 15,000 L/day; 20,000 L/day; 25,000 L/day; 30,000 L/day; 35,000 L/day; 40,000 L/day; 45,000 L/day; 50,000 L/day; 55,000 L/day; 60,000 L/day; 65,000 L/day; 70,000 L/day; 75,000 L/day; 80,000 L/day; 85,000 L/day; 90,000 L/day; 95,000 L/day; 100,000 L/day; 150,000 L/day; 200,000 L/day; 250,000 L/day; 300,000 L/day; 350,000 L/day; 400,000 L/day; 450,000 L/day; 500,000 L/day; 550,000 L/day; 600,000 L/day; 650,000 L/day; 700,000 L/day; 750,000 L/day; 800,000 L/day; 850,000 L/day; 900,000 L/day; 950,000 L/day; 1 million L/day; 5 million L/day; 10 million L/day; 20 million L/day; 30 million L/day; 40 million L/day; 50 million L/day; 60 million L/day; 70 million L/day; 80 million L/day; 90 million L/day; 100 million L/day; 110 million L/day; 120 million L/day; 130 million L/day; 140 million L/day; 150 million L/day; 160 million L/day; 170 million L/day; 180 million L/day; 190 million L/day; 200 million L/day; 220 million L/day; 240 million L/day; 260 million L/day; 280 million L/day; 300 million L/day; 400 million L/day; 500 million L/day; or 1 billion L/day. Water discharges may also be configured to discharge more than 1 billion L/day. Water discharges, in particular embodiments, may be configured to discharge an amount of water in any of the ranges: 5,000 L/day to 1 billion L/day; 5,000 L/day to 1 million L/day; 5,000 L/day to 100 million L/day; 5,000 L/day to 20,000 L/day; 20,000 L/day to 40,000 L/day; 40,000 L/day to 60,000 L/day; 60,000 L/day to 80,000 L/day; 80,000 L/day to 100,000 L/day; 100,000 L/day to 120,000 L/day; 120,000 L/day to 140,000 L/day; 140,000 L/day to 160,000 L/day; 160,000 L/day to 180,000 L/day; 180,000 L/day to 200,000 L/day; 200,000 L/day to 250,000 L/day; 250,000 L/day to 300,000 L/day; 3000,000 L/day to 350,000 L/day; 100,000 L/day to 200,000 L/day; 200,000 L/day to 300,000 L/day; 300,000 L/day to 400,000 L/day; 400,000 L/day to 500,000 L/day; 500,000 L/day to 600,000 L/day; 600,000 L/day to 700,000 L/day; 700,000 L/day to 800,000 L/day; 800,000 L/day to 900,000 L/day; 900,000 L/day to 1 million L/day; 1 million L/day to 20 million L/day; 20 million L/day to 40 million L/day; 40 million L/day to 60 million L/day; 60 million L/day to 80 million L/day; or 80 million L/day to 100 million L/day. In some aspects, the amount of water moving (e.g., flowing) through a discharge is variable within a time period (e.g., one minute, one hour, one day, one month, one year).

In various aspects, the water discharge or a portion thereof is positioned outside the aquaculture center. In certain aspects, the water discharge or a portion thereof is operably coupled to an aquaculture center (e.g., a fresh water aquaculture center). In some instances, the water discharge or a portion thereof is positioned outside the portion of an aquaculture center containing tanks for cultivating aquatic organisms therein and/or the data center containing the one or more computer systems and/or associated components and/or outside the desalination plant. In some embodiments, the water discharge is operably connected to (e.g., in fluid communication with) at least one portion the water temperature control subsystem located inside the portion of an aquaculture center containing tanks for cultivating aquatic organisms therein (e.g., a portion of the aquaculture center wherein water is heated and/or cooled and/or maintained at a particular temperature) and/or a water cooling subsystem located inside the portion of the data center containing the one or more computer systems and/or associated components wherein cool water is heated (e.g., heated to warm water).

Embodiments of the systems include a water discharge positioned within a water source (e.g., positioned at a depth of 15 m or more in a water source). Some variations of the systems include a water discharge and/or at least one opening therein (e.g., an opening at the end of the discharge furthest from the portion of an aquaculture center containing tanks for cultivating aquatic organisms therein and/or portion of the data center housing computer systems and related components) positioned at a depth of 1 m or more; 2 m or more; 3 m or more; 4 m or more; 5 m or more; 6 m or more; 7 m or more; 8 m or more; 9 m or more; 10 m or more; 11 m or more; 12 m or more; 13 m or more; 14 m or more; 16 m or more; 17 m or more; 18 m or more; 19 m or more; 20 m or more; 25 m or more; 30 m or more; 35 m or more; 40 m or more; 45 m or more; 50 m or more; 60 m or more; 70 m or more; 80 m or more; 90 m or more; 100 m; 200 m or more and/or 300 m or more in a water source. In some aspects, systems include a water discharge and/or at least one opening therein positioned below and/or within a particular zone (e.g., euphotic and/or disphotic, and/or aphotic zone) in a water source. Systems, in some embodiments, include a water discharge and/or at least one opening therein positioned below the photic zone in a water source.

In certain variations of the disclosed systems wherein a water discharge is positioned at a particular depth within a water source (e.g., a depth of 15 m or more), its center (e.g., the center-most point of a water discharge) and/or the top edge (e.g., the edge or portion closest to the surface of the water) of the water discharge and/or the bottom edge (e.g., the edge or portion furthest from the surface of the water) of the water discharge is positioned at that particular depth below the surface of the water. In certain aspects, a water discharge positioned at a particular depth within a water source may have an opening wherein the center of the opening (e.g., the center-most point of a circular and/or square opening) and/or the top edge (e.g., the edge or portion closest to the surface of the water) of the opening and/or the bottom edge (e.g., the edge or portion furthest from the surface of the water) of the opening is positioned at that particular depth below the surface of the water.

The water discharges of the disclosed systems may, in various aspects, be composed of one or more materials or one or more types of materials. Examples of materials that the water discharges of the disclosed systems may be composed of include polymers, ceramics, metals, glasses and/or a combination thereof. In some aspects, the water discharges are not composed of metal or material that is subject to corrosion (e.g., corrosion by rust). Where appropriate, water discharges are composed of plumbing materials. For example, water discharges may be composed of polyvinyl chloride (PVC) pipes and/or joints and one or more adhesives for fastening the pipes in a water-tight manner. In select aspects, one or more materials of the water discharges may be rigid. In some instances, one or more materials of the water discharges may be flexible (e.g., one or more rubber tubes or hoses). However, these examples of materials are not limiting and the materials of the water discharges may be any material, or combination of materials, having the structural and chemical properties necessary to function in the disclosed systems as described herein.

Power Plant

In certain aspects, the disclosed systems optionally include one or more power plants. As used herein, the terms "power plant" and "power station", refer to a facility for the generation of electric power. In particular aspects, power plants house components for generating and transmitting electric power.

Power plants, in select embodiments, generate electrical power from fossil fuels (e.g., coal, oil, and/or natural gas), nuclear power or renewable energy sources. In certain aspects, power plants provide electric power to consumers of electric power outside the power plant.

In various instances, power plants include an intake for receiving materials and/or energy into the power plant. In some aspects, power plants include at least one conversion element for converting the materials and/or energy received into the intake to electric power. In select instances, power plants include an electrical yield component configured for providing an output of electrical power from the plant. In various embodiments, power plants include one or more control systems configured for controlling the amount of materials and/or energy received into an intake and/or for controlling the amount of materials and/or energy converted to electric power and/or for controlling the amount of electric power output through the electrical yield component.

Power plants, in particular versions, produce carbon emissions. In certain instances, power plants (e.g., power plants operating to produce electric power independently) produce an amount of carbon emissions for each function or portion of a function performed by the power plant or components thereof. For example, in some embodiments, power plants produce a certain amount of carbon emissions per amount of electrical power produced.

In some embodiments, power plants include electrical components. For example, power plants may include temperature and/or lighting control systems as well as electrical components for electrically connecting consumers of electrical power to the power plant. In select instances, power plants (e.g., power plants operating independently) use an amount of energy (e.g., electrical energy) for each amount of electrical power produced.

Certain variations of power plants produce heat. As such, in some embodiments, power plants include a cooling system. In some instances, cooling systems of power plants are configured to cool power plants using cool water (e.g., seawater). In certain embodiments, power plant cooling systems include an interconnected structure of pipes and/or containers and/or pumps (e.g., pumps as described above) configured for moving water through (e.g., in to and/or out of) the interconnected structure and thereby cooling the power plant. In select versions, power plants produce and output warm water. In certain aspects, power plant cooling systems are operably connected to water discharges (e.g., warm water discharges), as described herein. In certain aspects, power plant cooling systems are operably connected (e.g., in fluid communication with) aquaculture centers, as described herein.

In particular embodiments, power plants are co-located with aquaculture centers and/or data centers. Power plants, in certain aspects, are operably connected to an aquaculture center and/or a data center. In some aspects, power plants may be in fluid communication with an aquaculture centers and/or a data center. In some versions, power plant cooling systems may be attached to a water temperature control subsystem of an aquaculture center and/or a water cooling subsystem of a data center such that water may move (e.g., flow) from a power plant to an aquaculture center and/or a data center and/or from an aquaculture center and/or a data center to a power plant.

Various embodiments of power plants provide electrical power to aquaculture centers and/or data centers (e.g. aquaculture centers and/or data centers co-located with power plants and/or desalination plants). As such, certain versions of the disclosed systems include power plants that are electrically connected (e.g., connected by at least one conductive material, such as a metal cable) to an aquaculture center and/or a data center. In certain aspects, power plants may provide all or a portion of the electrical power required to operate an aquaculture center and/or a data center and/or the electrical components therein.

Certain embodiments of the disclosed systems that include a power plant co-located with an aquaculture center and/or a data center are configured to produce fewer carbon emissions as compared to the same power plant, aquaculture center and/or data center operating independently (e.g., an aquaculture center and/or a power plant, data center not connected in a manner such that water and/or electricity may travel from one to the other). Also, some variations of the disclosed systems that include a power plant co-located with an aquaculture center and/or a data center are configured to use less energy (e.g., electrical energy) as compared to the same power plant, aquaculture center and/or data center operating independently (e.g., an aquaculture center and/or a power plant, data center not connected in a manner such that water and/or electricity may travel from one to the other). As such, select versions of the disclosed systems that include a power plant co-located with an aquaculture center and/or a data center are configured to be more energy-efficient than the same power plant, aquaculture center and/or data center operating independently.

Water Desalination Plant

The disclosed systems, in certain instances, optionally include one or more desalination plants. As used herein, the term "desalination plant" refers to a facility configured and/or used for desalinating water. In some embodiments, desalination plants house components for desalinating water.

In some variations, desalination plants operate by distillation (e.g., vacuum distillation). Desalination plants may be configured to boil water (e.g., salt water) and collect water (e.g., water vapor) having a significantly reduced or eliminated salt concentration. Desalination plants, in select aspects, boil water at less than atmospheric pressure. In some versions, desalination plants operate by multistage flash distillation. As such, desalination plants may be configured to operate by one or more processes that distill water (e.g., seawater) by flashing an amount of water into steam in multiple stages of concurrent heat exchangers. In particular instances, desalination plants using distillation (e.g., vacuum distillation) employ heated water (e.g., warm water) in one or more processes. Certain variations of desalination plants are configured to desalinate water by using both distillation and reverse osmosis processes.

In certain embodiments, desalination plants of the disclosed systems are reverse osmosis desalination plants. In some aspects, reverse osmosis desalination plants use pressure and/or one or more semipermeable membranes to desalinate water. In certain versions of reverse osmosis desalination plants, water is passed through one or more semipermeable membranes in order to remove salt and/or minerals and/or other impurities therefrom. In some instances, the efficiency of a desalination process of a reverse osmosis desalination plant is higher if the temperature of the water input (e.g., salt water) into the desalination process is higher. In various embodiments, a desalination process of a reverse osmosis desalination plant uses less energy per volume of water desalinated if the temperature of the water input (e.g., salt water) into the desalination process is higher.

By desalinating water, in some aspects, desalination plants may produce desalinated water and/or brine (e.g., both desalinated water and brine). As used herein, the term "brine" refers to a solution discharged from a desalination plant. In select aspects, brine may be a solution (e.g., a concentrate) including salt (e.g., sodium chloride) and water. In select versions, brine has a salt concentration in the range 3.5% to 26% or 5% to 26%. In certain embodiments, brine includes one or more of the impurities removed from water during desalination (e.g., minerals or other components). In some instances, brine may include residues of chemicals used to treat (e.g., clean) a desalination plant.

Embodiments of desalination plants include at least one filter configured for purifying water. In some aspects, the at least one filter of the water intakes includes one or more semipermeable membranes.

In some instances, desalination plants are configured such that an amount of water may move through the plants. In select embodiments, desalination plants are configured such that an amount of water may move through the plants by traveling through an interconnected desalination structure of operably connected pipes and/or containers. The interconnected desalination structure of operably connected pipes and/or containers, in select variations, is composed of the same and/or different materials or types of materials as the water temperature control systems and/or water cooling subsystems and/or water intakes described herein. In particular embodiments, the interconnected desalination structure of operably connected pipes and/or containers of a desalination plant is connected to and/or includes a coupling component for receiving water from a water source and/or a water discharge for discharging water from the desalination plant.

In particular versions, desalination plants include one or more valves for controlling the movement of water through the desalination plant (e.g., through an interconnected desalination structure of operably connected pipes and/or containers within a desalination plant). In some embodiments, the valves are controllable (e.g., configured to be opened and/or closed in reaction to a designated signal or action). In some aspects each valve is individually controllable (e.g., a valve may be opened and or closed while other valves are not). In select instances, the one or more valves include electrical components and may be configured to receive an electronic signal from a controller operably connected thereto.

In various aspects, a desalination plant is configured such that water can move (i.e., flow) into the plant from a water source (e.g., a water temperature control subsystem and/or a water cooling subsystem). In some embodiments, the water source of a water desalination plant is the water temperature control subsystem of an aquaculture center (e.g., a co-located aquaculture center). In some embodiments, the water source of a water desalination plant is the water cooling subsystem of a data center (e.g., a co-located data center). As such, where desired, water desalination plants may be configured to receive warm water from water temperature control subsystems or water cooling subsystems or a portion thereof (e.g., a warm water discharge or output) and/or another source (e.g., a power plant). In some embodiments, water desalination plants are configured such that warm water received into a desalination plant is used in one or more water desalination processes therein.

In certain versions, desalination plants include one or more coupling components. Coupling components may be configured for connecting to and receiving water from a water temperature control subsystem or a water cooling subsystem. In some aspects, one or more coupling components are positioned within a desalination plant and/or within an aquaculture center and/or between a desalination plant and an aquaculture center (e.g., at the interface of a desalination and aquaculture center). In select instances, the one or one or more coupling components are a pipe or a series of pipes for providing fluid communication between the desalination plant and aquaculture center. In some embodiments, the one or more coupling components are operably connected (e.g., attached in a water-tight manner) to a warm water discharge or output of an aquaculture center. The one or more coupling components may be operably connected to a water intake (e.g., a cool water intake), as described herein. As such, water (e.g., cool water) may be added to the water (e.g., warm water) passing out of a water temperature control subsystem of an aquaculture center or the water cooling subsystem of a data center before it enters a desalination plant. The one or more coupling components may be operably connected to a water discharge (e.g., a warm water discharge), as described herein. As such, all or a portion of the water channeled to flow through the coupling component may be channeled to flow into a water source and all or a portion of the water channeled to flow through the coupling component may be channeled to flow into the water desalination plant. The one or more coupling components may also be operably connected to one or more other coupling components.

In certain embodiments, coupling components are configured to have an amount of water (e.g., seawater) move (e.g., flow) through them per time period (e.g, minute or hour or day). For example, coupling components may be configured to have up to the following amounts of water move (e.g., flow) through them: 500 L/day; 1,000 L/day; 5,000 L/day; 10,000 L/day; 15,000 L/day; 20,000 L/day; 25,000 L/day; 30,000 L/day; 35,000 L/day; 40,000 L/day; 45,000 L/day; 50,000 L/day; 55,000 L/day; 60,000 L/day; 65,000 L/day; 70,000 L/day; 75,000 L/day; 80,000 L/day; 85,000 L/day; 90,000 L/day; 95,000 L/day; 100,000 L/day; 150,000 L/day; 200,000 L/day; 250,000 L/day; 300,000 L/day; 350,000 L/day; 400,000 L/day; 450,000 L/day; 500,000 L/day; 550,000 L/day; 600,000 L/day; 650,000 L/day; 700,000 L/day; 750,000 L/day; 800,000 L/day; 850,000 L/day; 900,000 L/day; 950,000 L/day; 1 million L/day; 5 million L/day; 10 million L/day; 20 million L/day; 30 million L/day; 40 million L/day; 50 million L/day; 60 million L/day; 70 million L/day; 80 million L/day; 90 million L/day; 100 million L/day; 110 million L/day; 120 million L/day; 130 million L/day; 140 million L/day; 150 million L/day; 160 million L/day; 170 million L/day; 180 million L/day; 190 million L/day; 200 million L/day; 220 million L/day; 240 million L/day; 260 million L/day; 280 million L/day; 300 million L/day; 400 million L/day; 500 million L/day; or 1 billion L/day. Coupling components may also be configured to have more than 1 billion L/day of water move (e.g., flow) through them. Coupling components, in particular embodiments, may be configured to have an amount of water move through them wherein the amount is in any of the ranges: 5,000 L/day to 1 billion L/day; 5,000 L/day to 1 million L/day; 5,000 L/day to 100 million L/day; 5,000 L/day to 20,000 L/day; 20,000 L/day to 40,000 L/day; 40,000 L/day to 60,000 L/day; 60,000 L/day to 80,000 L/day; 80,000 L/day to 100,000 L/day; 100,000 L/day to 120,000 L/day; 120,000 L/day to 140,000 L/day; 140,000 L/day to 160,000 L/day; 160,000 L/day to 180,000 L/day; 180,000 L/day to 200,000 L/day; 200,000 L/day to 250,000 L/day; 250,000 L/day to 300,000 L/day; 3000,000 L/day to 350,000 L/day; 100,000 L/day to 200,000 L/day; 200,000 L/day to 300,000 L/day; 300,000 L/day to 400,000 L/day; 400,000 L/day to 500,000 L/day; 500,000 L/day to 600,000 L/day; 600,000 L/day to 700,000 L/day; 700,000 L/day to 800,000 L/day; 800,000 L/day to 900,000 L/day; 900,000 L/day to 1 million L/day; 1 million L/day to 20 million L/day; 20 million L/day to 40 million L/day; 40 million L/day to 60 million L/day; 60 million L/day to 80 million L/day; or 80 million L/day to 100 million L/day. In some aspects, the amount of water moving (e.g., flowing) through a coupling component is variable within a time period (e.g., one minute, one hour, one day, one month, one year).

A desalination plant, in some embodiments, is configured such that brine moves (i.e., flows) out of the desalination plant through a water discharge. In certain instances, desalination plants are operably connected to (e.g., in fluid communication with) water discharges, as described herein. In some versions, desalination plants are configured such that water flows out of the desalination plant (e.g., through a water discharge) and into an aquaculture center (e.g., a fresh water aquaculture center).

A desalination plant, in various aspects, is configured such that desalinated (e.g., water having a low salt concentration) moves out of the desalination plant through a water expulsion aspect. The water expulsion aspect may be one or more pipes. The water expulsion aspect may also be configured to transport the desalinated water to a location where the desalinated water may be used and/or stored. The water expulsion aspect may, in certain aspects, also be configured to transport the desalinated water to a location from which the desalinated water can be further transported.

In some embodiments, the water expulsion aspect is operably coupled to an aquaculture center. In some aspects, water moving out of the desalination plant through a water expulsion aspect may be used in an aquaculture center (e.g., a fresh water aquaculture center).

Desalination plants, in certain versions, include a pump. In some embodiments, a pump is a means for causing water to move through desalination plants and/or other components (e.g., aquaculture centers; water temperature control subsystems; data centers; water cooling subsystems; water intakes; and/or water discharges), as described herein. In particular instances, a pump causes water to move unidirectionally or bidirectionally through desalination plants and/or other components, as described herein. In some embodiments, a pump is electrically powered and/or gasoline powered and/or powered by another means. In certain aspects, a pump is operably connected to a power source (i.e., the power source of the aquaculture center), as described herein. In some instances, a pump may be operably connected to a power plant. In particular embodiments, tides, and/or a pump powered by tides, cause water to move through the desalination plants and/or other components (e.g., aquaculture centers) described herein. In some embodiments, one or more pumps are located within aquaculture centers and/or desalination plants, as described herein. In select versions, one or more pumps are located outside aquaculture centers and/or desalination plants, as described herein.

Where desired, desalination plants include electrical components. For example, desalination plants may include temperature and/or lighting control systems as well as electrical systems for desalinating water. In certain aspects, desalination plants (e.g., desalination plants operating independently) use an amount of energy (e.g., electrical energy) for each volume of water desalinated.

As such, desalination plants may be operably connected to at least one power source (e.g., one or more power plants and/or the power source of a data center, as described herein). Certain embodiments of desalination plants include a power source (e.g., a source from which electrical power may be obtained). Power sources, where appropriate, and as described above, generate or obtain power from renewable energy sources. In certain aspects, desalination plants may be operably connected (e.g., electrically connected) to an aquaculture center or one or more of the components thereof.

In select versions, desalination plants and/or power sources of desalination plants produce carbon emissions. In certain aspects, desalination plants (e.g., desalination plants operating independently) produce an amount of carbon emissions for each function or portion of a function performed by the desalination plant or components thereof. For example, in some embodiments, desalination plants produce a certain amount of carbon emissions per volume of desalinated water produced.

The disclosed systems, in certain instances, include one or more desalination plants co-located with one or more aquaculture centers. As noted above, certain embodiments of the disclosed systems include desalination plants that are configured to receive and desalinate warm water output from an aquaculture center (e.g., a co-located aquaculture center). Certain variations of the disclosed systems that include desalination plants configured to receive and desalinate warm water output from an aquaculture center are thereby configured to produce fewer carbon emissions as compared to the same aquaculture center and water desalination plant operating independently (e.g., an aquaculture center and water desalination plant not connected in a manner such that water or electricity may travel from one to the other). Also, in some instances, the disclosed systems include desalination plants that are configured to receive and desalinate warm water output from an aquaculture center and are thereby configured to use less energy (e.g., electrical energy) as compared to the same aquaculture center and water desalination plant operating independently (e.g., an aquaculture center and water desalination plant not connected in a manner such that water or electricity may travel from one to the other).

Methods

As summarized above, aspects of the present disclosure also include methods for cooling a heat source, e.g., as described above (such as a data center) and cultivating aquatic organisms. In certain instances, the methods have steps (e.g., sequential steps and/or simultaneous steps) including (1) cooling a data center with a water cooling subsystem comprising a cool water intake and a warm water discharge; and (2) cultivating aquatic organisms with an aquaculture center co-located with the data center and comprising a water temperature control subsystem comprising a warm water intake for receiving water from the warm water discharge.

As used herein, the word "cultivating" refers to culturing and/or hatching and/or breeding and/or rearing and/or growing organisms (e.g., aquatic organisms).

The word "cooling" is used broadly and generically to refer to lowering the temperature of an aspect (e.g., a data center and/or an aquaculture center or a portion of one or more components therein) or a portion of an aspect (e.g., a portion of a data center that is heated by one or more components). Likewise, the word "heating" is used broadly and generically to refer to increasing the temperature of an aspect (e.g., an aquaculture center or a portion of one or more components therein and/or water therein) or a portion of an aspect (e.g., a portion of an aquaculture center and/or a volume of water therein).

As such, in some embodiments, cooling a data center with a water cooling subsystem includes decreasing the temperature of at least a portion of the data center or one or more components of the data center (e.g., a computer system thereof).

As used herein, the phrase "cool water intake" refers to a water intake configured to receive cool water. In some embodiments, cooling a data center with a water cooling subsystem includes moving (e.g., intermittently or continually pumping) water (e.g., cool water) through at least a portion of the water cooling subsystem.

In some instances of the disclosed methods, cooling a data center and cultivating aquatic organisms includes obtaining (e.g., intermittently or constantly pumping) water (e.g., seawater) from a cool water intake. Variations of the disclosed methods include positioning a cool water intake, or at least one opening therein, at a particular depth within a water source (e.g., below the photic zone of a water source). In some aspects of the disclosed methods, a water source is an ocean or sea.

Particular aspects of the disclosed methods include receiving water (e.g., warm water) into a water temperature control subsystem from a water cooling subsystem of a data center. As such, various aspects of the disclosed methods include moving (e.g., pumping water (e.g., warm water from a water cooling subsystem into a water temperature control subsystem (e.g., a water temperature control subsystem operatively coupled to the water temperature control subsystem.

In certain aspects of the disclosed methods, the methods include discharging (e.g., intermittently or constantly pumping) brine from a desalination plant into a body of water (e.g., an ocean or sea). Particular versions of the disclosed methods include discharging brine at a particular depth within a body of water (e.g., within or below the photic zone of an ocean or sea).

Embodiments of the disclosed methods include positioning a cool water intake or at least one opening therein and/or discharging brine at a depth of 15 m or more in a water source. Some variations of the methods include positioning a cool water intake or at least one opening therein and/or discharging brine at a depth of 1 m or more; 2 m or more; 3 m or more; 4 m or more; 5 m or more; 6 m or more; 7 m or more; 8 m or more; 9 m or more; 10 m or more; 11 m or more; 12 m or more; 13 m or more; 14 m or more; 16 m or more; 17 m or more; 18 m or more; 19 m or more; 20 m or more; 25 m or more; 30 m or more; 35 m or more; 40 m or more; 45 m or more; 50 m or more; 60 m or more; 70 m or more; 80 m or more; 90 m or more; 100 m or more; 200 m or more; and/or 300 m or more in a body of water (e.g., an ocean or sea). In select instances, the disclosed methods include positioning a cool water intake or at least one opening therein and/or discharging brine below and/or within a particular zone (e.g., euphotic and/or disphotic, and/or aphotic and/or benthic zone) in a body of water (e.g., an ocean or sea).

In certain variations of the methods, positioning a cool water intake, or at least one opening therein and/or discharging brine, at a particular depth within a water source (e.g., a depth of 15 m or more), includes positioning the center of the intake (e.g., the center-most point of a water intake) and/or the center of a water discharge (e.g., the center-most point of a warm water discharge) and/or the top edge (e.g., the edge or portion closest to the surface of the water) of the water intake and/or water discharge and/or the bottom edge (e.g., the edge or portion furthest from the surface of the water) of the water intake and/or water discharge at that particular depth below the surface of the water. Where desired, a water intake and/or water discharge positioned at a particular depth within a water source may have an opening wherein the center of the opening (e.g., the center-most point of a circular and/or square opening) and/or the top edge (e.g., the edge or portion closest to the surface of the water) of the opening and/or the bottom edge (e.g., the edge or portion closest to the surface of the water) of the opening is positioned at that particular depth below the surface of the water.

As indicated above, some embodiments of the systems further include a co-located desalination plant. In such embodiments, the methods may further include desalinating water. The word "desalinating" is used broadly and generically to refer to conducting one or more processes (e.g., reverse osmosis) to desalinate water. As such, in some embodiments, desalinating water includes receiving water (e.g., warm water) from a water discharge of an aquaculture center and/or a data center into a desalination plant (e.g., a desalination plant co-located with the aquaculture center and/or the data center) and conducting one or more desalination processes to desalinate the water. In some embodiments of the disclosed methods, the methods include co-locating and/or operably connecting an aquaculture center and/or a data center and/or a desalination plant.

In particular aspects of the methods, desalinating water includes receiving water (e.g., warm water) from a water discharge of a data center and/or an aquaculture center into a desalination plant (e.g., a desalination plant co-located with the data center and/or aquaculture center) and conducting one or more desalination processes to desalinate the water. In some instances, desalinating water includes moving (e.g., intermittently or continually pumping) water (e.g., warm water) through one or more components of a desalination plant and thereby desalinating the water.

The desalination plant, in some aspects of the methods, is a reverse osmosis desalination plant. As such, in select instances, water is desalinated using one or more reverse osmosis processes. In some embodiments, water (e.g., warm water) is desalinated by passing the water through one or more semipermeable membranes in order to remove salt and/or minerals and/or other impurities therefrom.

As noted above, in some embodiments, aquaculture centers, data centers, desalination plants and/or their power sources produce carbon emissions. In certain aspects, aquaculture centers and/or data centers and/or desalination plants (e.g., desalination plants operating independently) produce an amount of carbon emissions for each function or portion of a function performed by the data center and/or desalination plant or components thereof. For example, in some variations, desalination plants produce a certain amount of carbon emissions per volume of desalinated water produced.

Also, as noted above, co-locating and/or operably connecting a data center, and/or an aquaculture center and/or a desalination plant can reduce their overall carbon emissions. As such, in some instances, the disclosed methods of cultivating aquatic organisms and desalinating salt water at a desalination plant co-located with the aquaculture center and/or data center produce fewer carbon emissions as compared to operating the same aquaculture center, data center and water desalination plant independently (e.g., an aquaculture center and data center and water desalination plant not connected in a manner such that water or electricity may travel from one to the other). In certain variations, the disclosed methods of cultivating aquatic organisms and cooling a co-located data center include producing a smaller carbon footprint as compared to the same aquaculture center and data center operating independently.

As noted above, in particular instances, data centers and/or aquaculture center and/or desalination plants use an amount of energy for each function performed by the data center and/or desalination plant and/or aquaculture center or components thereof. For example, aquaculture centers may use a specific amount of energy per amount of aquatic organisms cultured and/or per volume of water heated with the water temperature control subsystem Also, as noted above, co-locating and/or operably connecting an aquaculture center and data center can improve their overall energy efficiency. As such, the disclosed methods of cultivating aquatic organisms and cooling a data center co-located with the aquaculture center may use less energy per amount of aquatic organisms cultured and/or per volume of data center cooling as compared to the same aquaculture center and data center operating independently (e.g., an aquaculture center and data center not connected in a manner such that water or electricity may travel from one to the other). In certain versions, the disclosed methods of cultivating aquatic organisms and cooling a data center co-located with the aquaculture center include cultivating aquatic organisms and cooling a data center in a more energy-efficient manner as compared to operating the same aquaculture center and data center independently.

In certain versions, the disclosed methods include co-locating and/or operably connecting an aquaculture center, and/or desalination plant, and/or power plant and/or data center. As such, in certain embodiments, the disclosed methods include obtaining power to operate the aquaculture center, and/or desalination plant and/or data center from a power plant co-located with the aquaculture center, desalination plant and/or data center.

As noted above, in some instances, aquaculture centers, data centers, desalination plants and/or power plants produce carbon emissions. In certain aspects, power plants (e.g., power plants operating to produce electric power independently) produce an amount of carbon emissions for each function or portion of a function performed by the power plant or components thereof. For example, power plants may produce a certain amount of carbon emissions per amount of electrical power produced.

Also, as noted above, co-locating and/or operably connecting an aquaculture center, data center, desalination plant and/or power plant can reduce their overall carbon emissions. As such, in various instances, the disclosed methods including obtaining power to operate the aquaculture center, and/or the data center and/or the desalination plant from a power plant co-located with the aquaculture center, and/or the data center and/or the desalination plant produce fewer carbon emissions as compared to operating the same aquaculture center, and/or data center, and/or water desalination plant and/or power plant independently. In some versions, the disclosed methods include producing a smaller carbon footprint as compared to the independent operation of an aquaculture center, and/or water desalination plant, and/or data center and/or power plant.

As noted above, co-locating and/or operably connecting an aquaculture center, and/or desalination plant, and/or data center and/or power plant can improve their overall energy efficiency. As such, in some instances, the disclosed methods that include obtaining power to operate an aquaculture center and desalination plant from a power plant co-located with the aquaculture center and the desalination plant use less energy per amount of aquatic organisms cultured and/or per volume of water heated with the water temperature control subsystem or per volume of water desalinated than the same aquaculture center, water desalination plant, data center and/or power plant operating independently (e.g., operating while not operably connected). In some versions, the disclosed methods of cultivating aquatic organisms and desalinating salt water at a desalination plant co-located with an aquaculture center by obtaining power to operate the aquaculture center and the desalination plant from a power plant co-located with the aquaculture center and the desalination plant include cultivating aquatic organisms, desalinating water and/or producing or obtaining power in a more energy-efficient manner as compared to operating the same aquaculture center, water desalination plant and power plant independently.

Utility

The subject systems and methods may be used to cultivate aquatic organisms and/or cool a data center. As described herein, in certain aspects, the disclosed systems may be configured to operate in a way that is more effective than operating components of the systems independently. For example, an aquaculture center co-located with and operably connected to a data center may allow the aquaculture center and/or data center to use less energy per amount (e.g., the number and/or volume and/or weight) of aquatic organisms cultivated and/or per amount of data center-cooling as compared to the same aquaculture center and data center operating independently. Similarly, the methods disclosed herein may allow the operation of an aquaculture center and/or data center and/or desalination plant to use less energy per amount of aquatic organisms cultivated and/or per volume of water heated with the water cooling subsystem and/or per volume of water desalinated as compared to methods of operating the same aquaculture center, data center and water desalination plant independently. Furthermore, the disclosed systems and methods relating to an aquaculture center co-located with and operably connected to a desalination plant and/or a data center and a power plant may allow the aquaculture center and/or desalination plant and/or data center and/or power plant to use less energy per amount of aquatic organisms cultivated and/or per volume of water heated with the water temperature control subsystem and/or per amount of data center-cooling and/or per volume of water desalinated and/or per amount of energy produced as compared to the same aquaculture center, water desalination plant and/or data center and power plant operating independently.

The disclosed systems and methods may also operate in such a way as to minimize the impact of aquaculture centers, desalination plants, data centers and/or power plants on the surrounding environment. For example, operation of the disclosed systems or utilization of the disclosed methods may result in an aquaculture center and data center that produce fewer carbon emissions or less pollution (e.g., thermal pollution) as compared to the same aquaculture center and data center operating independently. Also, operation of the disclosed systems or utilization of the disclosed methods may result in an aquaculture center, water desalination plant, data center and power plant that produce fewer carbon emissions or less pollution (e.g., thermal pollution) as compared to the same aquaculture center, water desalination plant, data center and power plant operating independently.

Accordingly, the subject systems and methods may be applied to minimize the amount of energy used by aquaculture centers, desalination plants, data centers and/or power plants. The subject systems and methods may also be applied to minimize the amount of carbon emissions from aquaculture centers, desalination plants, data centers and/or power plants. By enhancing efficiency of operation and minimizing carbon emissions, the disclosed systems and methods are useful to minimize costs associated with aquaculture centers, desalination plants, data centers and/or power plants and to promote the quality of the surrounding environments.

Embodiments of the present disclosure are further described by, but not limited to, the following clauses:

1. A system comprising:
    (a) a heat source comprising a water cooling subsystem configured to receive cool water and output warm water; and
    (b) an aquaculture center co-located with heat source and comprising a water temperature control subsystem configured to receive the output warm water.
2. The system according to Clause 1, wherein the cool water is received from an ocean or sea.
3. The system according to Clause 1, wherein the water cooling subsystem comprises a water intake.
4. The system according to Clause 3, wherein the water intake is positioned at a depth of 15 m or more in a water source.
5. The system according to Clause 3, wherein the water intake is positioned below the photic zone in a water source.
6. The system according to any of the preceding clauses, further comprising a water discharge for discharging water from the aquaculture center.
7. The system according to Clause 6, wherein the water discharge is positioned at a depth of 15 m or more in a body of water.
8. The system according to Clause 7, wherein the body of water is the same body of water from which the water cooling subsystem receives the cool water.
9. The system according to any of the preceding clauses, further comprising a power plant co-located with the data center and the aquaculture center.
10. The system according to Clause 9, wherein the power plant is operably connected to both of the data center and the aquaculture center.
11. The system according to any of the preceding clauses, wherein the heat source and aquaculture center are configured to produce fewer carbon emissions as compared to the same heat source and aquaculture center operating independently.
12. The system according to any of the preceding clauses, wherein the heat source and aquaculture center are configured to use less energy per amount of heat source cooling and per amount of aquatic life cultivated as compared to the same heat source and aquaculture center operating independently.
13. The system according to any of the preceding clauses, wherein the heat source is a data center.
14. The system according to Clause 13, wherein the data center has a power usage effectiveness less than 2.
15. The system according to Clause 14, wherein the data center has a power usage effectiveness ranging from 1 to 1.3.
16. A method of cooling a heat source, the method comprising:
    (a) cooling the heat source with a water cooling subsystem comprising a cool water intake and a warm water discharge; and
    (b) cultivating aquatic organisms with an aquaculture center co-located with the heat source and comprising a water temperature control subsystem comprising a warm water intake for receiving water from the warm water discharge.
17. The method according to Clause 16, wherein the water cooling subsystem is configured to obtain water from the cool water intake.
18. The method according to Clause 17, wherein the cool water intake is positioned below the photic zone of a water source.
19. The method according to Clause 18, wherein the water source is an ocean or sea.
20. The method according to any of the preceding clauses, wherein the method produces fewer carbon emissions as compared to the same heat source and aquaculture center operating independently.
21. The method according to any of Clauses 16 to 20, wherein the method uses less energy per amount of heat source cooling and per amount of aquatic organisms cultivated as compared to the same heat source and aquaculture center operating independently.
22. The method according to any of Clauses 16 to 21, further comprising obtaining power to operate the heat source and the aquaculture center from a power plant co-located with the heat source and the aquaculture center.
23. The method according to Clause 22, wherein the method produces fewer carbon emissions than the same heat source, aquaculture center and power plant operating independently.
24. The method according to Clauses 22 or 23, wherein the method uses less energy per amount of heat source cooling or per amount of aquatic organisms cultivated as compared to the same heat source, aquaculture center and power plant operating independently.
25. The method according to any of Clauses 16 to 24, wherein the heat source is a data center.
26. The method according to Clause 25, wherein the method comprises maintaining the power usage effectiveness of the data center below 2.
27. The method according to Clause 26, wherein the method comprises maintaining the power usage effectiveness of the data center ranging from 1 to 1.3.
28. A system comprising:
    (a) an aquaculture center comprising a water temperature control subsystem configured to receive cool water and output warm water; and
    (b) a water desalination plant co-located with the aquaculture center and configured to receive and desalinate the output warm water.
29. The system according to Clause 28, wherein the cool water is received from an ocean or sea.
30. The system according to Clause 28, wherein the water temperature control subsystems comprises a water intake.

31. The system according to Clause 30, wherein the water intake is positioned at a depth of 15 m or more in a water source.
32. The system according to Clause 30, wherein the water intake is positioned below the photic zone in a water source.
33. The system according to Clause 28, further comprising a water discharge for discharging brine from the water desalination plant.
34. The system according to Clause 33, wherein the water discharge is positioned at a depth of 15 m or more in a body of water.
35. The system according to Clause 34, wherein the body of water is the same body of water from which the water temperature control subsystems receives the cool water.
36. The system according to Clause 28, further comprising a power plant co-located with the aquaculture center and the water desalination plant.
37. The system according to Clause 36, wherein the power plant is operably connected to both of the aquaculture center and the water desalination plant.
38. The system according to Clause 28, wherein the aquaculture center and water desalination plant are configured to produce fewer carbon emissions as compared to the same aquaculture center and water desalination plant operating independently.
39. The system according to Clause 36, wherein the aquaculture center, water desalination plant and power plant are configured to produce fewer carbon emissions as compared to the same aquaculture center, water desalination plant and power plant operating independently.
40. The system according to Clause 28, wherein the aquaculture center and water desalination plant are configured to use less energy per volume of water heated with the water temperature control subsystem and per volume of water desalinated as compared to the same aquaculture center and water desalination plant operating independently.
41. The system according to Clause 36, wherein the aquaculture center, water desalination plant and power plant are configured to use less energy per amount of volume of water heated with the water temperature control subsystem and per volume of water desalinated as compared to the same aquaculture center, water desalination plant and power plant operating independently.
42. The system according to Clause 28, further comprising a data center co-located with the aquaculture center and the water desalination plant.
43. The system according to Clause 42, wherein the data center is operably connected to both of the aquaculture center and the water desalination plant.
44. The system according to Clause 42, wherein the aquaculture center, water desalination plant and data center are configured to produce fewer carbon emissions as compared to the same aquaculture center, water desalination plant and data center operating independently.
45. The system according to Clause 42, wherein the aquaculture center, water desalination plant and data center are configured to use less energy per amount of volume of water heated with the water temperature control subsystem and per volume of water desalinated as compared to the same data center, water desalination plant and data center operating independently.
46. The system according to Clause 28, wherein the water desalination plant is a reverse osmosis desalination plant.
47. The system according to Clause 28, wherein the aquaculture center is a salt water aquaculture center.
48. A method of cultivating aquatic organisms, the method comprising:

(a) heating water in an aquaculture center with a water temperature control subsystem comprising a cool water intake and a warm water discharge; and
(b) desalinating warm water received from the warm water discharge at a desalination plant that is co-located with the aquaculture center.

49. The method according to Clause 48, wherein the water temperature control subsystem is configured to obtain seawater from the cool water intake.
50. The method according to Clause 48, wherein the desalination plant is a reverse osmosis desalination plant.
51. The method according to Clause 48, wherein the cool water intake is positioned below the photic zone of a water source.
52. The method according to Clause 51, wherein the water source is an ocean or sea.
53. The method according to Clause 52, wherein the method further comprises discharging brine from the desalination plant into the ocean or sea.
54. The method according to Clause 53, wherein the brine is discharged below the photic zone of the ocean or sea.
55. The method according to Clause 48, wherein the method produces fewer carbon emissions as compared to the same aquaculture center and water desalination plant operating independently.
56. The method according to Clause 48, wherein the method uses less energy per volume of water heated with the water temperature control subsystem and per volume of water desalinated as compared to the same aquaculture center and water desalination plant operating independently.
57. The method according to Clause 48, further comprising obtaining power to operate the aquaculture center and the desalination plant from a power plant co-located with the aquaculture center and the desalination plant.
58. The method according to Clause 57, wherein the method produces fewer carbon emissions than the same aquaculture center, water desalination plant and power plant operating independently.
59. The method according to Clause 58, wherein the method uses less energy per amount of volume of water heated with the water temperature control subsystem or per volume of water desalinated than the same aquaculture center, water desalination plant and power plant operating independently.
60. The method according to Clause 48, wherein the aquaculture center is a salt water aquaculture center.
61. A system comprising:

(a) a water desalination plant configured to receive and desalinate water; and
(b) an aquaculture center co-located with the water desalination plant and configured to receive desalinated water from the water desalination plant for use in aquaculture.

62. The system according to Clause 61, wherein the aquaculture center is a fresh water aquaculture center.
63. A method of cultivating aquatic organisms, the method comprising:

(a) desalinating water received into a water desalination plant; and
(b) cultivating aquatic organisms in an aquaculture center co-located with the water desalination plant using desalinated water received into the aquaculture center from the water desalinization plant.

64. The method according to Clause 63, wherein the aquaculture center is a fresh water aquaculture center.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims. It is also to be understood that the terminology used herein is for the purpose of describing particular embodiments only, and is not intended to be limiting, since the scope of the present invention will be limited only by the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A system comprising:
   (a) a heat source comprising a water cooling subsystem configured to receive cool water and output warm water; and
   (b) an aquaculture center co-located with the heat source, wherein the aquaculture center comprises:
      a water temperature control subsystem configured to receive the output warm water from the heat source; and
      a water discharge for discharging water from the aquaculture center.

2. The system according to claim 1, wherein the cool water is received from an ocean or sea.

3. The system according to claim 1, wherein the water cooling subsystem comprises a water intake.

4. The system according to claim 3, wherein the water intake is positioned at a depth of 15 m or more in a water source.

5. The system according to claim 3, wherein the water intake is positioned below the photic zone in a water source.

6. The system according to claim 1, wherein the water discharge is positioned at a depth of 15 m or more in a body of water.

7. The system according to claim 6, wherein the body of water is the same body of water from which the water cooling subsystem receives the cool water.

8. The system according to claim 1, further comprising a power plant co-located with the heat source and the aquaculture center.

9. The system according to claim 8, wherein the power plant is operably connected to both of the heat source and the aquaculture center.

10. The system according to claim 1, wherein the heat source and aquaculture center are configured to produce fewer carbon emissions as compared to the same heat source and aquaculture center operating independently.

11. The system according to claim 1, wherein the heat source and aquaculture center are configured to use less energy per amount of heat source cooling and per amount of aquatic life cultivated as compared to the same heat source and aquaculture center operating independently.

12. The system according to claim 1, wherein the heat source is a data center.

13. The system according to claim 12, wherein the data center has a power usage effectiveness less than 2.

14. The system according to claim 1, wherein the heat source is present on land.

15. The system according to claim 1, further comprising a desalination plant operably connected to the aquaculture center.

16. A method of cooling a heat source, the method comprising:
   (a) cooling the heat source with a water cooling subsystem comprising a cool water intake and a warm water discharge; and
   (b) cultivating aquatic organisms with an aquaculture center co-located with the heat source and comprising a water temperature control subsystem comprising a warm water intake for receiving warm water from the heat source and a water discharge for discharging water from the aquaculture center.

17. The method according to claim 16, wherein the heat source comprises a data center.

18. The method according to claim 17, wherein the data center has a power usage effectiveness less than 2.

19. The method according to claim 16, wherein the heat source is present on land.

20. The method according to claim 16, wherein the cool water is received from an ocean or sea.

* * * * *